(12) United States Patent
Tanaka et al.

(10) Patent No.: US 8,937,014 B2
(45) Date of Patent: Jan. 20, 2015

(54) LIQUID TREATMENT APPARATUS AND LIQUID TREATMENT METHOD

(75) Inventors: Takashi Tanaka, Yamanashi (JP); Yusuke Saito, Yamanashi (JP); Mitsuaki Iwashita, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/879,175

(22) PCT Filed: Aug. 31, 2011

(86) PCT No.: PCT/JP2011/069707
§ 371 (c)(1),
(2), (4) Date: May 2, 2013

(87) PCT Pub. No.: WO2012/049913
PCT Pub. Date: Apr. 19, 2012

(65) Prior Publication Data
US 2014/0148006 A1    May 29, 2014

(30) Foreign Application Priority Data

Oct. 14, 2010    (JP) ................................. 2010-231382

(51) Int. Cl.
| H01L 21/44 | (2006.01) |
| H01L 21/67 | (2006.01) |
| C23C 18/16 | (2006.01) |
| H01L 21/288 | (2006.01) |

(52) U.S. Cl.
CPC ........ *H01L 21/6723* (2013.01); *C23C 18/1675* (2013.01); *C23C 18/1676* (2013.01); *C23C 18/168* (2013.01); *H01L 21/288* (2013.01)
USPC .......... 438/660; 438/597; 438/694; 438/745; 438/758; 438/778; 118/313; 118/321; 118/500; 118/503

(58) Field of Classification Search
None
See application file for complete search history.

(56) References Cited

U.S. PATENT DOCUMENTS

2005/0230260 A1    10/2005    Bleck et al.
2010/0015791 A1*    1/2010    Tanaka et al. ................. 438/597

FOREIGN PATENT DOCUMENTS

| JP | 2001-073157 A | 3/2001 |
| JP | 2006-111938 A | 4/2006 |
| JP | 2007-525595 A1 | 9/2007 |
| JP | 2010-024496 A | 2/2010 |

OTHER PUBLICATIONS

International Search Report for PCT/JP2011/069707 dated Oct. 11, 2011.

* cited by examiner

*Primary Examiner* — Kyoung Lee
(74) *Attorney, Agent, or Firm* — Pearne & Gordon LLP

(57) ABSTRACT

A liquid treatment apparatus of continuously performing a plating process on multiple substrates includes a temperature controlling container for accommodating a plating liquid; a temperature controller for controlling a temperature of the plating liquid in the temperature controlling container; a holding unit for holding the substrates one by one at a preset position; a nozzle having a supply hole through which the temperature-controlled plating liquid in the temperature controlling container is discharged to a processing surface of the substrate; a pushing unit for pushing the temperature-controlled plating liquid in the temperature controlling container toward the supply hole of the nozzle; and a supply control unit for controlling a timing when the plating liquid is pushed by the pushing unit. The temperature controller controls the temperature of the plating liquid in the temperature controlling container based on the timing when the plating liquid is pushed by the pushing unit.

7 Claims, 12 Drawing Sheets

LIQUID TREATMENT APPARATUS AND LIQUID TREATMENT METHOD

CROSS-REFERENCE TO RELATED APPLICATION

This application is a U.S. national phase application under 35 U.S.C. §371 of PCT Application No. PCT/JP2011/069707 filed on Aug. 31, 2011, which claims the benefit of Japanese Patent Application No. 2010-231382 filed on Oct. 14, 2010, the entire disclosures of which are incorporated herein by reference.

TECHNICAL FIELD

The present disclosure relates to a liquid treatment apparatus for performing a liquid treatment such as plating onto a substrate serving as a target object and also relates a liquid treatment method.

BACKGROUND ART

In designing and manufacturing a semiconductor device, there has been an increasing demand for a higher operating speed and a higher level of integration. Meanwhile, it has been pointed out that electromigration (EM) easily occurs due to an increase in current density caused by a high-speed operation or miniaturization of a wiring, so that wiring disconnection may be caused. This results in deterioration in reliability. For this reason, Cu (copper) or Ag (silver) or the like having a low resistivity has been used as a wiring material formed on a substrate of the semiconductor device. Particularly, since the cooper has a low resistivity of about 1.8 $\mu\Omega\cdot cm$ and is expected to exhibit high EM resistance, it is regarded as a material suitable for achieving a high processing rate of a semiconductor device.

Typically, a damascene method has been used to form a Cu wiring on a substrate. This method includes forming a via and a trench of an insulating film by etching and filing the via and the trench of the insulating film with the Cu wiring. Further, there has been made an attempt to enhance an EM resistance of the semiconductor device by supplying a plating liquid containing CoWB (cobalt.tungsten.boron), CoWP (cobalt.tungsten.phosphorus) or the like on a surface of a substrate having a Cu wiring and by coating a metal film called as a "cap metal" on the Cu wiring by means of electroless plating (see, for example, Patent Document 1).

The cap metal is formed by supplying the electroless plating liquid on the surface of the substrate having the Cu wiring. By way of example, the substrate is held on a rotatable holder, and the electroless plating liquid is supplied while rotating the rotatable holder, so that a uniform liquid flow can be formed on the surface of the substrate. Thus, a uniform cap metal can be formed over the entire surface of the substrate (see, for example, Patent Document 2).

However, as for the electroless plating, it has been known that a precipitation ratio of metal is highly affected by reaction conditions such as a composition and a temperature of the plating liquid. Further, it has been known that particles are generated from the plating liquid heated to a processing temperature as a result of the reaction. For this reason, in a process for continuously performing plating processes on a wafer, if the process is stopped due to a request or a trouble in the process, a quality of the plating liquid heated to the processing temperature is deteriorated. Therefore, it is difficult to form a cap metal having a uniform film thickness on the wafer.

Patent Document 1: Japan Patent Laid-open Publication No. 2006-111938
Patent Document 2: Japan Patent Laid-open Publication No. 2001-073157

DISCLOSURE OF THE INVENTION

Problems to Be Solved by the Invention

As described above, in a conventional liquid treatment apparatus and a liquid treatment method, if a process is stopped, a quality of a plating liquid is deteriorated. The following illustrative embodiments are developed to solve this problem and provide a liquid treatment apparatus and a liquid treatment method capable of preventing a quality of a plating liquid from being deteriorated.

Means for Solving the Problems

In accordance with an aspect of the present disclosure, there is provided a liquid treatment apparatus of continuously performing a plating process on a multiple number of substrates. The liquid treatment apparatus includes a temperature controlling container configured to accommodate a plating liquid; a temperature controller configured to control a temperature of the plating liquid accommodated in the temperature controlling container; a holding unit configured to hold the substrates one by one at a preset position; a nozzle having a supply hole through which the temperature-controlled plating liquid accommodated in the temperature controlling container is discharged to a processing surface of the substrate held by the holding unit; a pushing unit configured to push the temperature-controlled plating liquid accommodated in the temperature controlling container toward the supply hole of the nozzle; and a supply control unit configured to control a timing when the plating liquid is pushed by the pushing unit. Further, the temperature controller is configured to control the temperature of the plating liquid accommodated in the temperature controlling container based on the timing when the plating liquid is pushed by the pushing unit.

Effect of the Invention

It is possible to provide a liquid treatment apparatus and a liquid treatment method capable of preventing a quality of a plating liquid from being deteriorated.

BEST MODE FOR CARRYING OUT THE INVENTION (Configuration of a Liquid Treatment Apparatus in Accordance with an Illustrative Embodiment)

Figure 1:
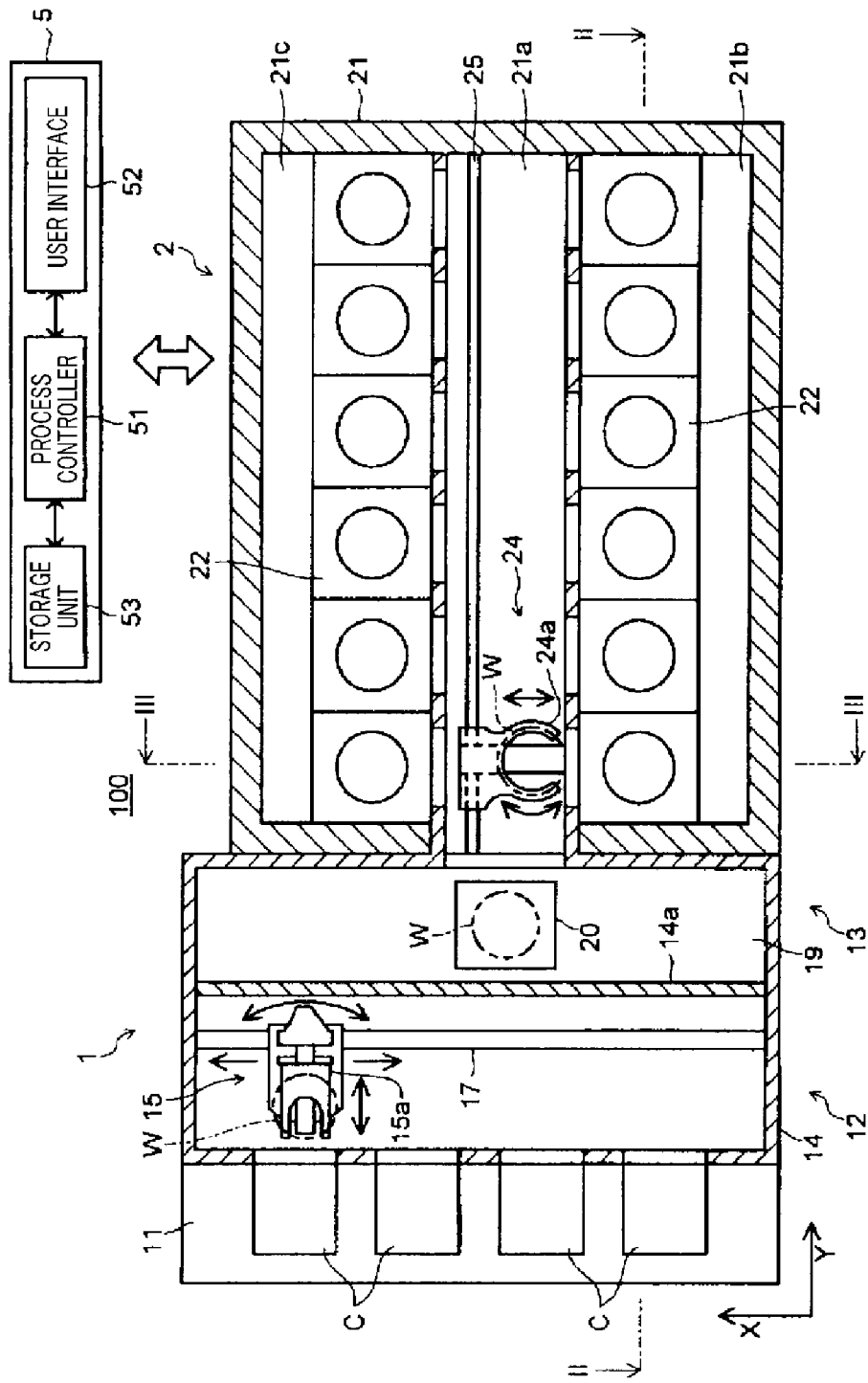
FIG. 1 is a plane view illustrating a schematic configuration of a liquid treatment apparatus in accordance with an illustrative embodiment.

Hereinafter, a liquid treatment apparatus in accordance with an illustrative embodiment will be explained in detail. In the following illustrative embodiment, there will be explained a liquid treatment apparatus that performs a plating process on a semiconductor wafer (hereinafter, simply referred to as "wafer"). FIG. 1 is a plane view illustrating a schematic configuration of a liquid treatment apparatus in accordance with the illustrative embodiment of the present disclosure, FIG. 2 is a cross-sectional view of a front side taken along a line II-II of FIG. 1, and FIG. 3 is a cross-sectional view of a lateral side taken along a line III-III of FIG. 1.

Figure 2:
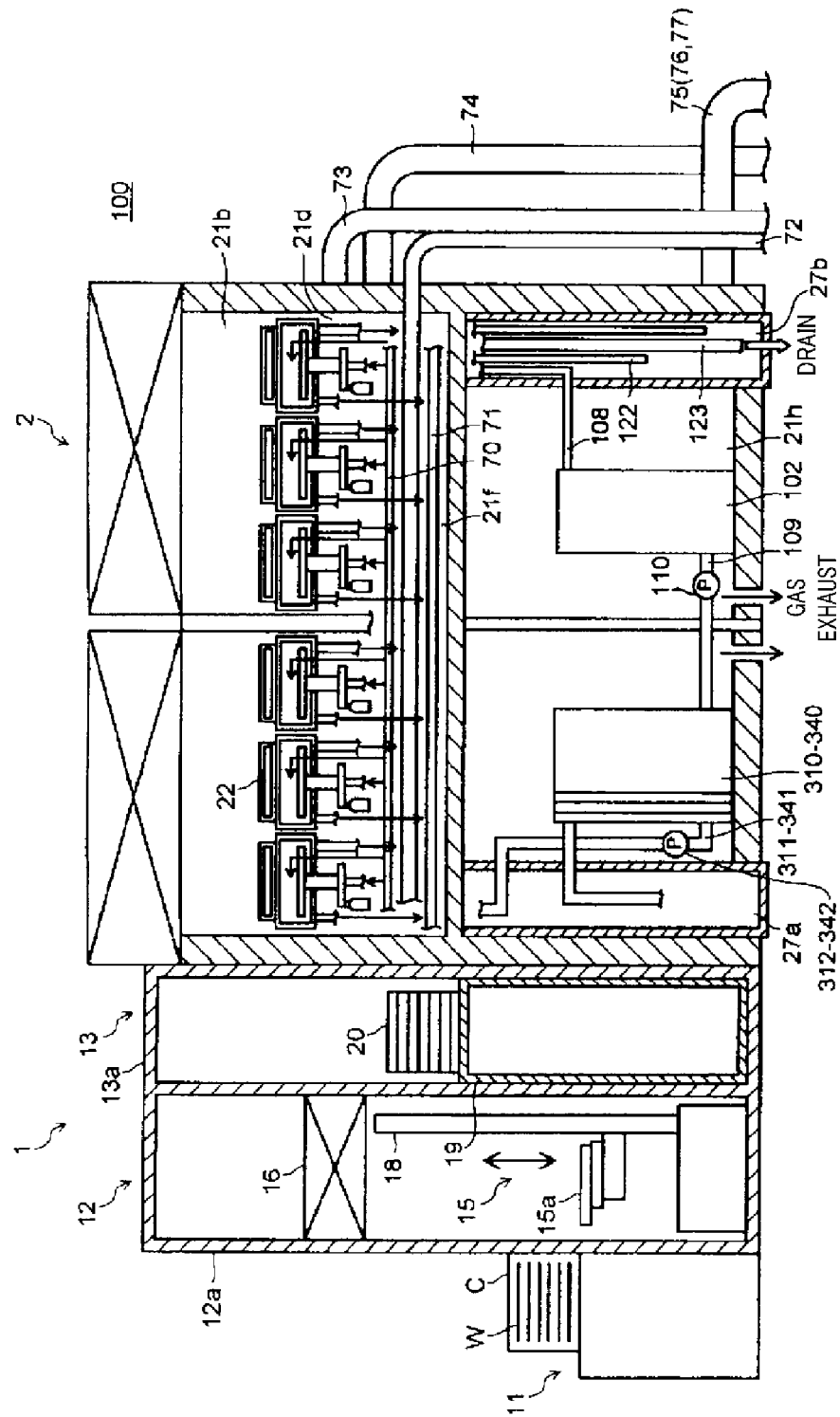
FIG. 2 is a cross-sectional view of a front side taken along a line II-II of FIG. 1.
Figure 3:
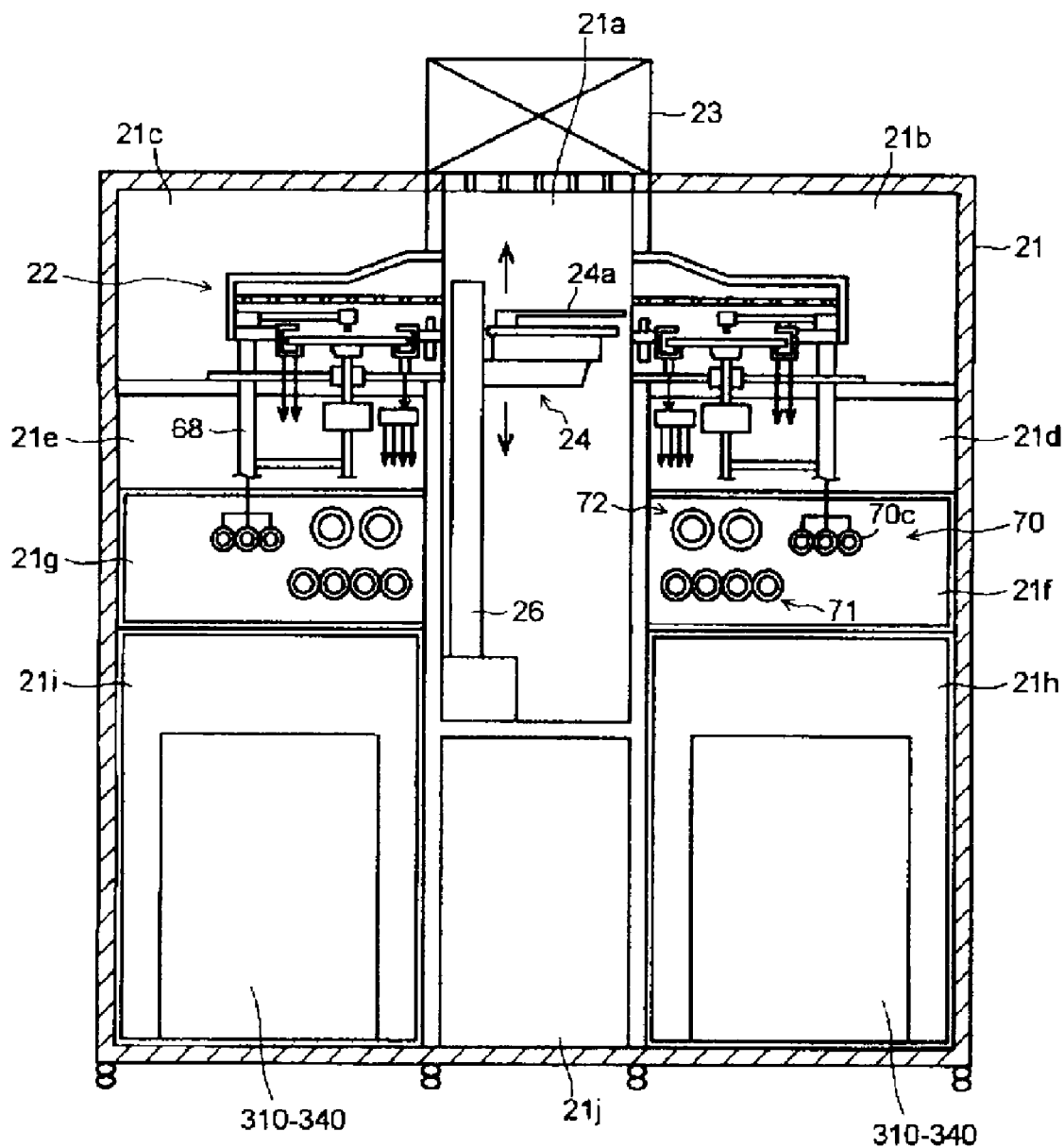
FIG. 3 is a cross-sectional view of a lateral side taken along a line III-III of FIG. 1.

As depicted in FIGS. 1 and 2, a liquid treatment apparatus 100 includes a loading/unloading station (substrate loading/unloading section) 1 that configured to mounts thereon wafer carriers C accommodating multiple wafers W and loads and unloads the wafers W, a process station (liquid treatment section) 2 for performing a plating process on the wafers W, and a controller 5 to be adjacent to one another.

The loading/unloading station 1 includes a carrier mounting unit 11 that mounts thereon the wafer carriers C accommodating multiple wafers W in a horizontal state, a transfer unit 12 that transfers the wafers W, a transit unit that transits the wafers W, and a housing 14 that accommodates the transfer unit 12 and the transit unit 13. In an example depicted in FIG. 1, the carrier mounting unit 11 can mount four wafer carriers C. The mounted wafer carriers C adhere to a vertical wall of the housing 14, and the wafers W within the wafer carriers C can be loaded into the transfer unit 12 without being exposed to atmosphere.

The housing 14 includes a partition member 14a that vertically partitions off the transfer unit 12 and the transit unit 13. The transfer unit 12 includes a transfer device 15 and a fan filter unit (FFU) 16 provided above the transfer device 15 to supply a down flow of clean air. The transfer device 15 includes a holding arm 15a that holds the wafers W, a device for moving the wafer holding arm 15a back and forth, a device for moving the wafer holding arm 15a along a horizontal guide 17 (see FIG. 1) extended in an X-direction in which the wafer carriers C are arranged, a device for moving the wafer holding arm 15a along a vertical guide 18 (see FIG. 2) provided in a vertical direction, and a device for rotating the wafer holding arm 15a in a horizontal plane. The wafers W are transferred between the wafer carriers C and the transit unit 13 by the transfer device 15.

The transit unit 13 includes a transit stage 19 and a transit bracket 20 that is provided on the transit stage 19 and includes multiple mounting units for mounting the wafers W. The wafers W are transited between the transit unit 13 and the process station 2 via the transit bracket 20.

The process station 2 includes a housing 21 having a hexahedral structure. The housing 21 includes a transfer room 21a that is provided at an upper central area of the housing 21 and serves as a transfer path extended in a Y-direction orthogonal to the X-direction in which the wafer carriers C are arranged, and two unit rooms 21b and 21c provided at both sides of the transfer room 21a. In an example depicted in FIG. 1, each of the unit rooms 21b and 21c includes six liquid treatment units 22, i.e. twelve liquid treatment units 22 in total, to be horizontally arranged along the transfer room 21a.

As depicted in FIG. 3, driving areas 21d and 21e each accommodating a driving system of the liquid treatment unit are provided under the unit rooms 21b and 21c, respectively, within the housing 21. Further, pipe boxes 21f and 21g each accommodating pipes are provided under the driving areas 21d and 21e, respectively. Furthermore, chemical liquid supply units 21h and 21i each serving as a processing liquid storage are provided under the pipe boxes 21f and 21g, respectively. Meanwhile, an exhaust space 21j for exhaust is provided under the transfer room 21a.

A fan filter unit (FFU) 23 is provided above the transfer room 21a to supply a down flow of clean air to the transfer room 21a. Within the transfer room 21a, a transfer device 24 is provided. The transfer device 24 includes a wafer holding arm 24a that holds the wafers W, a device for moving the wafer holding arm 24a back and forth, a device for moving the wafer holding arm 24a in the Y-direction along a horizontal guide 25 (see FIG. 1) provided in the transfer room 21a, a device for moving the wafer holding arm 24a along a vertical guide 26 (see FIG. 3) provided in a vertical direction, and a device for rotating the wafer holding arm 24a in a horizontal plane. The wafers W are loaded and unloaded into/from the respective liquid treatment units 22 by the transfer device 24.

Further, the transit stage 19 is provided at a position higher than the carrier mounting unit 11, and the liquid treatment unit 22 is provided at a position higher than the transit stage 19. Within the pipe boxes 21f and 21g, a processing liquid pipe group 70, a liquid drain pipe group 71, and an exhaust pipe group 72 are horizontally arranged. As depicted in FIG. 2, a first vertical pipe area 27a is provided on an end portion at a side of the loading/unloading station 1 of chemical liquid supply units 21h and 21i and a second vertical pipe area 27b is provided on an end portion at an opposite side of the loading/unloading station 1. Each of the chemical liquid supply units 21h and 21i includes a first tank 310 that stores a pre-cleaning processing liquid $L_1$ used for a pre-treatment of an electroless plating process on the wafer W, a second tank 320 that stores a post-cleaning processing liquid $L_2$ used for a post-treatment of the electroless plating process on the wafer W, a third tank 330 that stores a plating liquid $L_3$ used for processing the wafer W, and a fourth tank 340 that stores an outer periphery processing liquid $L_4$ used for processing an outer periphery of the wafer W.

As depicted in FIG. 2, lower side walls of the first to fourth tanks 310 to 340 are connected to pipes 311 to 341 for discharging a chemical liquid from an inside thereof and upper side walls thereof are connected to a return pipe for returning the chemical liquid. The pipes 311 to 341 include pumps 312 to 342, respectively. As depicted in FIG. 2, a collection tank 102 is connected to a pipe 108 for collecting the processed chemical liquid. The collection tank 102 and the first to fourth tanks 310 to 340 are connected to a connecting pipe 109. The connecting pipe 109 includes a pump 110 and is configured to purify the chemical liquid collected to the collection tank 102 and return it to the first to fourth tanks 310 to 340.

A part of the liquid drain pipe group 71 provided in the pipe boxes 21f and 21g is connected to a drain pipe 123. The drain pipe 123 is extended downwardly through the second vertical pipe area 27b, and a liquid drain is discarded through the drain pipe 123 to a factory pipe provided under a floor.

The FFU 23 supplies clean air into the transfer room 21a and a part of the clean air is introduced into the unit rooms 21b and 21c and the liquid treatment unit 22 from the transfer room 21a. The clean air introduced into the unit rooms 21b and 21c is introduced to the driving areas 21d and 21e. The driving areas 21d and 21e are connected to an exhaust pipe 73 through which particles generated in the unit rooms 21b and 21c and particles mainly generated in the driving system of the driving areas 21d and 21e are forcibly exhausted. A gas from the liquid treatment unit 22 is exhausted through the pipe group 72 provided in the pipe boxes 21f and 21g. The pipe boxes 21f and 21g are connected to an exhaust pipe 74 for exhausting an inside of the pipe boxes 21f and 21g. A bottom portion of the exhaust space 21j is connected two exhaust pipes 75 and 76 for exhausting a gas introduced through the transfer room 21a, and an exhaust pipe 77 for a transfer/driving system for exhausting a gas introduced through the transfer device 24.

As shown in FIG. 2, the exhaust pipe group 72, the exhaust pipes 73, 74, 75, and 76, and the exhaust pipe 77 for the transfer/driving system are extended outwardly from a sidewall of the housing 21. Further, these pipes are extended downwardly and connected to the factory pipe provided under the floor.

The controller 5 includes a process controller 51 having a micro-processor, a user interface 52 connected to the process controller 51, and a storage unit 53 that stores a computer program for controlling an operation of a semiconductor manufacturing apparatus in accordance with the present illustrative embodiment. The controller 5 controls the loading/unloading station 1 and the process station 2. The controller 5 is on-line connected to a non-illustrated host computer and controls the semiconductor manufacturing apparatus based on an instruction from the host computer. The user interface 52 includes, for example, a key board and a display. The storage unit 53 includes, for example, a CD-ROM, a hard disk, and a nonvolatile memory.

The liquid treatment apparatus 100 configured as described above takes out a wafer W from the carrier C mounted on the carrier mounting unit 11 of the loading/unloading station 1 by the transfer device 15 and mounts the wafer W on a mounting unit of the transit bracket provided on the transit stage 19. This operation is carried out repeatedly. The wafer W mounted on the mounting unit of the transit bracket 20 is transferred in sequence by the transfer device 24 of the process station 2 and loaded into any one liquid treatment unit 22.

(Configuration of a Liquid Treatment Unit in Accordance with an Illustrative Embodiment)

Figure 4:
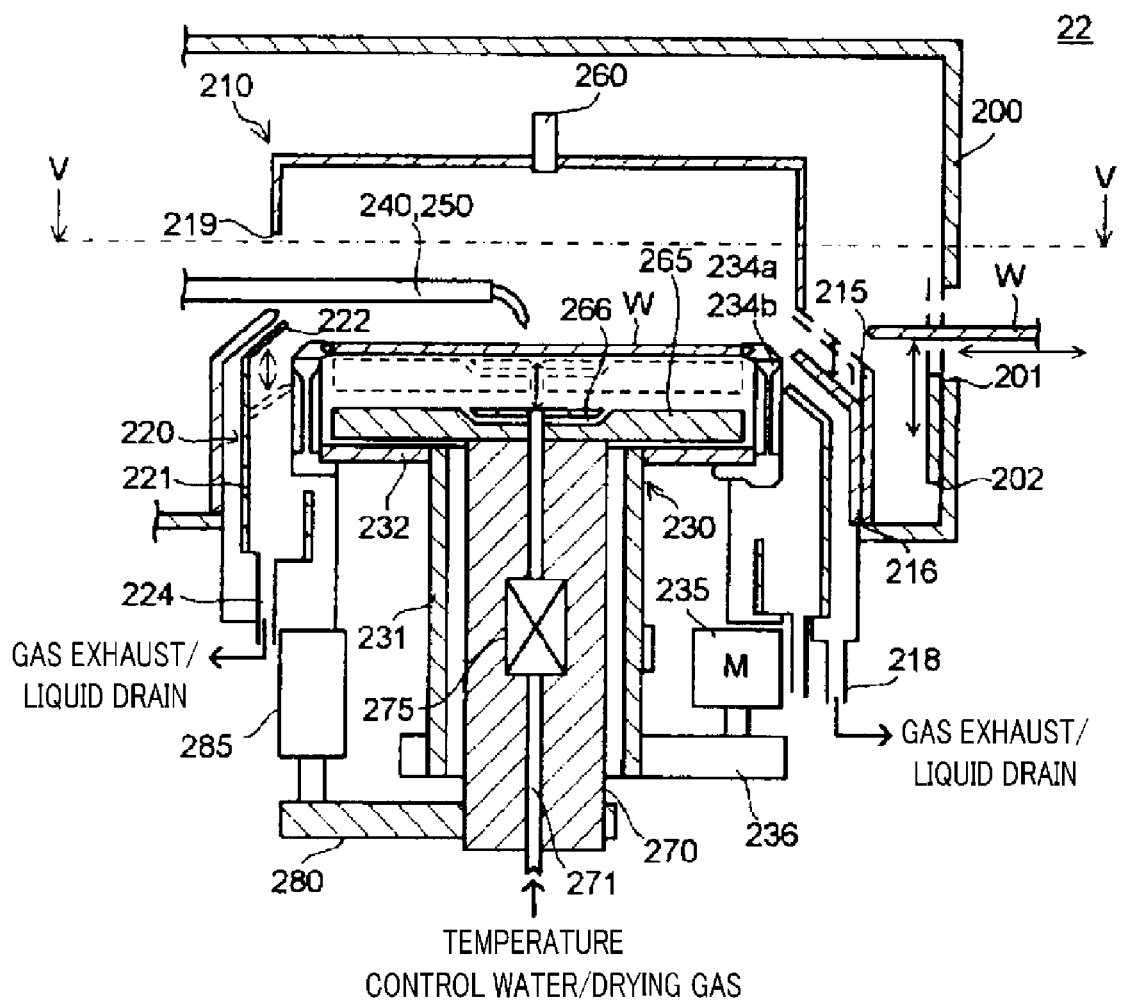
FIG. 4 is a cross-sectional view illustrating a configuration of a liquid treatment unit in accordance with the illustrative embodiment.

Hereinafter, the liquid treatment unit 22 in accordance with an illustrative embodiment will be explained in detail with reference to FIGS. 4 to 6. As depicted in FIG. 4, the liquid treatment unit 22 includes an outer chamber 210, an inner chamber 220, a spin chuck 230, a first fluid supply unit 240, a second fluid supply unit 250, a gas supply unit 260, and a back plate 265.

The outer chamber 210 is provided within a housing 200 and configured to perform a plating process. The outer chamber 210 has a cylindrical shape surrounding an accommodation position of the wafer W and is fixed to a bottom surface of the housing 200. At a side surface of the outer chamber 210, a window 215 for loading/unloading the wafer W is provided and configured to be opened and closed by a shutter 216. At a side surface facing the side surface including the window 215 of the outer chamber 210, a shutter 219 is provided for operations of the first and second fluid supply units 240 and 250 to be opened and closed. At an upper surface of the outer chamber 210, the gas supply unit 260 is provided. At a lower area of the outer chamber 210, a drain discharge opening 218 for discharging a gas or a processing liquid is formed.

The inner chamber 220 receives a processing liquid dispersed from the wafer W and is provided within the outer chamber 210. The inner chamber 220 has a cylindrical shape between the outer chamber 210 and the accommodation position of the wafer W and includes a drain discharge opening 224 for gas exhaust and liquid drain. The inner chamber 220 can be moved up and down by a non-illustrated elevator such as a gas cylinder within the outer chamber 210. The inner chamber 220 is moved up and down such that its upper end portion 222 is moved between a position (process position) slightly higher than the accommodation position of the wafer W and a position (retreat position) lower than the process position. Herein, the process position means a position where an electroless plating process is performed on the wafer W and the retreat position means a position where the wafer W is loaded and unloaded or the wafer W is cleaned.

The spin chuck 230 is a substrate fixing device that substantially horizontally holds the wafer W. The spin chuck 230 includes a rotary cylindrical body 231, an annular rotary plate 232, supporting pins 234a, and pressing pins 234b. The annular rotary plate 232 is horizontally extended from an upper end portion of the rotary cylindrical body 231, and the supporting pins 234a are equi-spaced along a periphery of an outer end portion of the rotary plate 232 to support an outer periphery of the wafer W. Further, the multiple pressing pins 234b are configured to press an outer peripheral surface of the wafer W. By way of example, as depicted in FIG. 5, three supporting pins 234a and three pressing pins 234b are arranged to be deviated from each other in a circumferential direction of the wafer W. The supporting pins 234a are configured to hold the wafer W and fix the wafer W at a certain accommodation position. The pressing pins 234b are configured to press the wafer W downwardly. There is provided a motor 235 beside the rotary cylindrical body 231. An endless belt 236 is wound between a driving axis of the motor 235 and the rotary cylindrical body 231. That is, the rotary cylindrical body 231 is rotated by the motor 235. The supporting pins 234a and the pressing pins 234b are rotated in a horizontal direction (in a surface direction of the wafer W) and the wafer W held by these pins is also rotated in the horizontal direction.

The gas supply unit 260 supplies a nitrogen gas or clean air into the outer chamber 210 to dry the wafer W. The supplied nitrogen gas or clean air is collected through the drain discharge opening 218 or 224 provided at a lower end of the outer chamber 210.

The back plate 265 faces a lower surface of the wafer W held by the spin chuck 230 and is provided between a position where the wafer W is held by the spin chuck 230 and the rotary plate 232. The back plate 265 includes a heater and is connected to a shaft 270 penetrating a center of an axis of the rotary cylindrical body 231. Within the back plate 265, there are provided a flow path 266 opened at multiple places on a surface of the back plate 265. The flow path 266 communicates with a fluid supply channel 271 penetrating a center of an axis of the shaft 270. The fluid supply channel 271 includes a heat exchanger 275. The heat exchanger 275 adjusts a temperature of a processing fluid such as pure water or a drying gas to a certain level. That is, the back plate 265 supplies the temperature-adjusted processing fluid toward the lower surface of the wafer W. A lower end portion of the shaft 270 is connected to an elevator 285 such as an air cylinder via a connecting member 280. That is, the back plate 265 is configured to be moved up and down between the wafer W held by the spin chuck 230 and the rotary plate 232 by the elevator 285 and the shaft 270.

Figure 5:
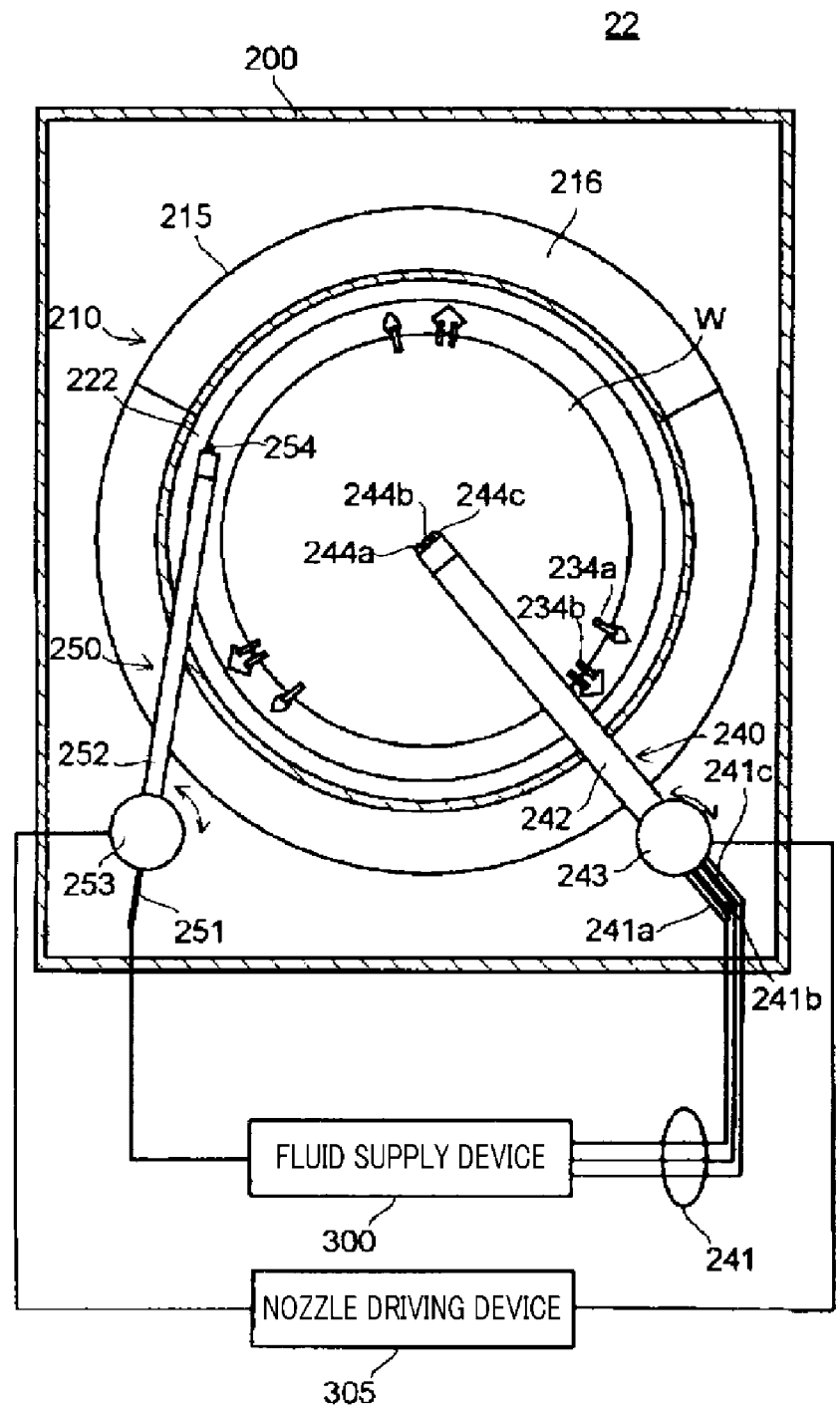
FIG. 5 is a cross-sectional view of a bottom side taken along a line V-V of FIG. 4.
Figure 6:
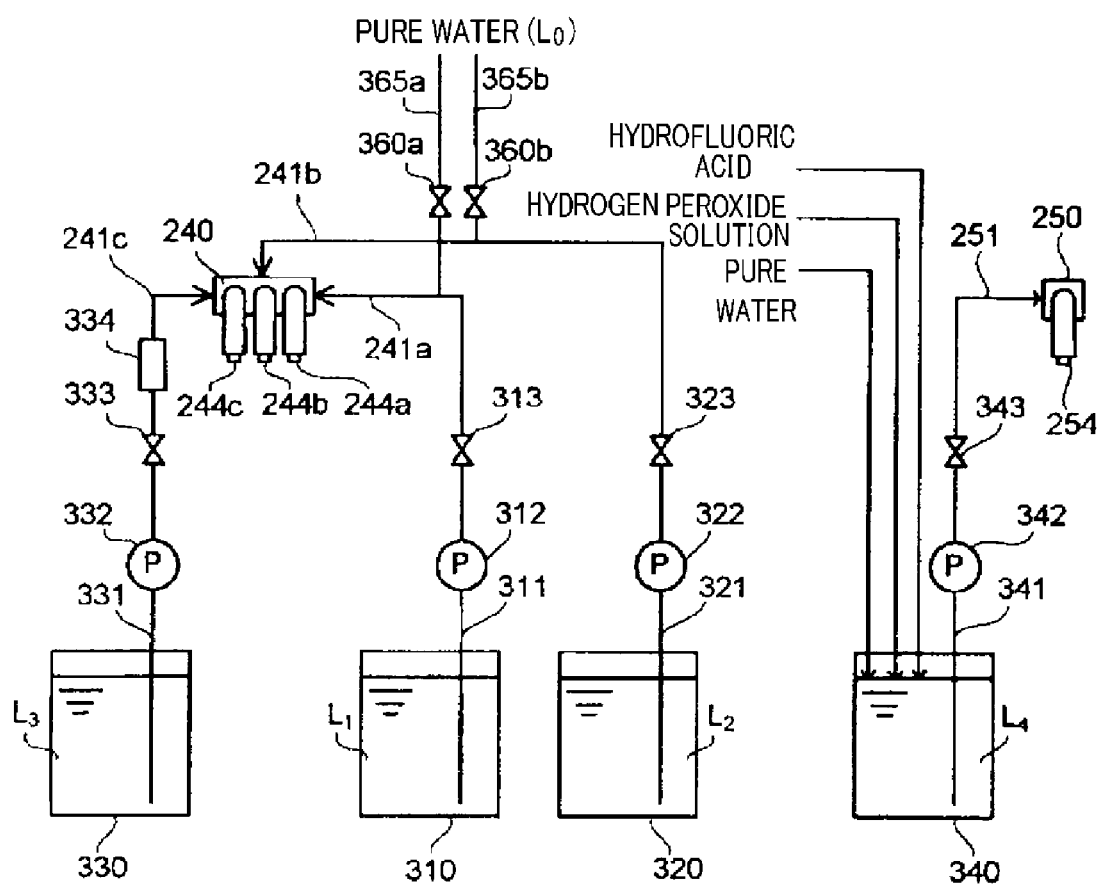
FIG. 6 illustrates a configuration of a fluid supply device in accordance with the illustrative embodiment.

As depicted in FIG. 5, the first and second fluid supply units 240 and 250 supply a processing liquid to an upper surface of the wafer W held by the spin chuck 230. The first and second fluid supply units 240 and 250 are connected to a fluid supply device 300 that stores a fluid such as a processing liquid and a nozzle driving device 305 that drives a supply nozzle. The first and second fluid supply units 240 and 250 are provided within the housing 200 with the outer chamber 210 interposed therebetween.

The first fluid supply unit 240 includes a first pipe 241 connected to the fluid supply device 300, a first arm 242 supporting the first pipe 241, and a first rotation driving unit 243 provided at a base of the first arm 242 and configured to rotate the first arm 242 around the base as an axis by using a stepping motor or the like. The first fluid supply unit 240 is configured to supply a processing fluid such as an electroless plating liquid. The first pipe 241 includes pipes 241a, 241b, and 241c which respectively supply three kinds of fluids and are connected to nozzles 244a, 244b, and 244c at a front end portion of the first arm 242.

Likewise, the second fluid supply unit 250 includes a second pipe 251 connected to the fluid supply device 300, a second arm 252 supporting the second pipe 251, and a second rotation driving unit 253 provided at a base of the second arm 252 and configured to rotate the second arm 252. The second pipe 251 is connected to a nozzle 254 at a front end portion of the second arm 252. The second fluid supply unit 250 is configured to supply a processing fluid used for processing the outer periphery (a periphery) of the wafer W. The first and second arms 242 and 252 pass through the shutter 219 provided at the outer chamber 210 and rotate above the wafer W held by the spin chuck 230.

(Configuration of a Fluid Supply Device in Accordance with an Illustrative Embodiment)

Hereinafter, the fluid supply device 300 will be explained in detail with reference to FIG. 6. The fluid supply device 300 supplies a processing fluid to the first and second fluid supply units 240 and 250. As depicted in FIG. 6, the fluid supply device 300 includes the first tank 310, the second tank 320, the third tank 330, and the fourth tank 340.

As described above, the first tank 310 stores the pre-cleaning processing liquid $L_1$ used for a pre-treatment of an electroless plating process on the wafer W and the second tank 320 stores the post-cleaning processing liquid $L_2$ used for a post-treatment of the electroless plating process on the wafer W. The first and second tanks 310 and 320 include temperature controllers (not illustrated) for respectively controlling the processing liquids $L_1$ and $L_2$ to have preset temperatures. The first and second tanks 310 and 320 are connected to a pipe 311 connected to the pipe 241a and a pipe 321 connected to the pipe 241b, respectively. The pipes 311 and 321 include the pumps 312 and 322 and valves 313 and 323, respectively. The temperature-controlled processing liquids $L_1$ and $L_2$ are supplied through the pipe 241a and the pipe 241b. That is, the processing liquids $L_1$ and $L_2$ are pushed to the nozzles 244a and 244b through the pipe 241a and the pipe 241b by operating the pumps 312 and 322 and the valves 313 and 323, respectively.

The third tank 330 stores the plating liquid $L_3$ used for processing the wafer W. The third tank 330 is connected to a pipe 331 connected to the pipe 241c. The pipe 331 includes a pump 332, a valve 333, and a temperature control unit 334 (a temperature controlling container, such as a heat exchanger) for controlling a temperature of the plating liquid $L_3$. That is, a temperature of the plating liquid $L_3$ is controlled by the temperature control unit 334 (in the temperature control unit 334), and the plating liquid $L_3$ is pushed to the nozzle 244c through the pipe 241c by cooperation between the pump 332 and the valve 333.

The fourth tank 340 stores the outer periphery processing liquid $L_4$ used for processing an outer periphery of the wafer W. The fourth tank 340 is connected to a pipe 341 connected to the second pipe 251. The pipe 341 includes a pump 342 and a valve 343. That is, the outer periphery processing liquid $L_4$ is pushed to the nozzle 254 through the second pipe 251 by cooperation between the pump 342 and the valve 343.

Further, the fourth tank 340 is connected to, for example, a pipe for supplying hydrofluoric acid, a pipe for supplying hydrogen peroxide solution, and a pipe for supplying pure water $L_0$. That is, the fourth tank 340 controls these liquids to be mixed at a preset mixing ratio.

The pipe 241a and the pipe 241b are respectively connected to pipes 365a and 365b for supplying the pure water $L_0$. The pipe 365a includes a valve 360a and the pipe 365b includes a valve 360b. That is, the nozzles 244a and 244b can supply the pure water $L_0$.

(Configuration of an Arm in Accordance with an Illustrative Embodiment)

Figure 7:
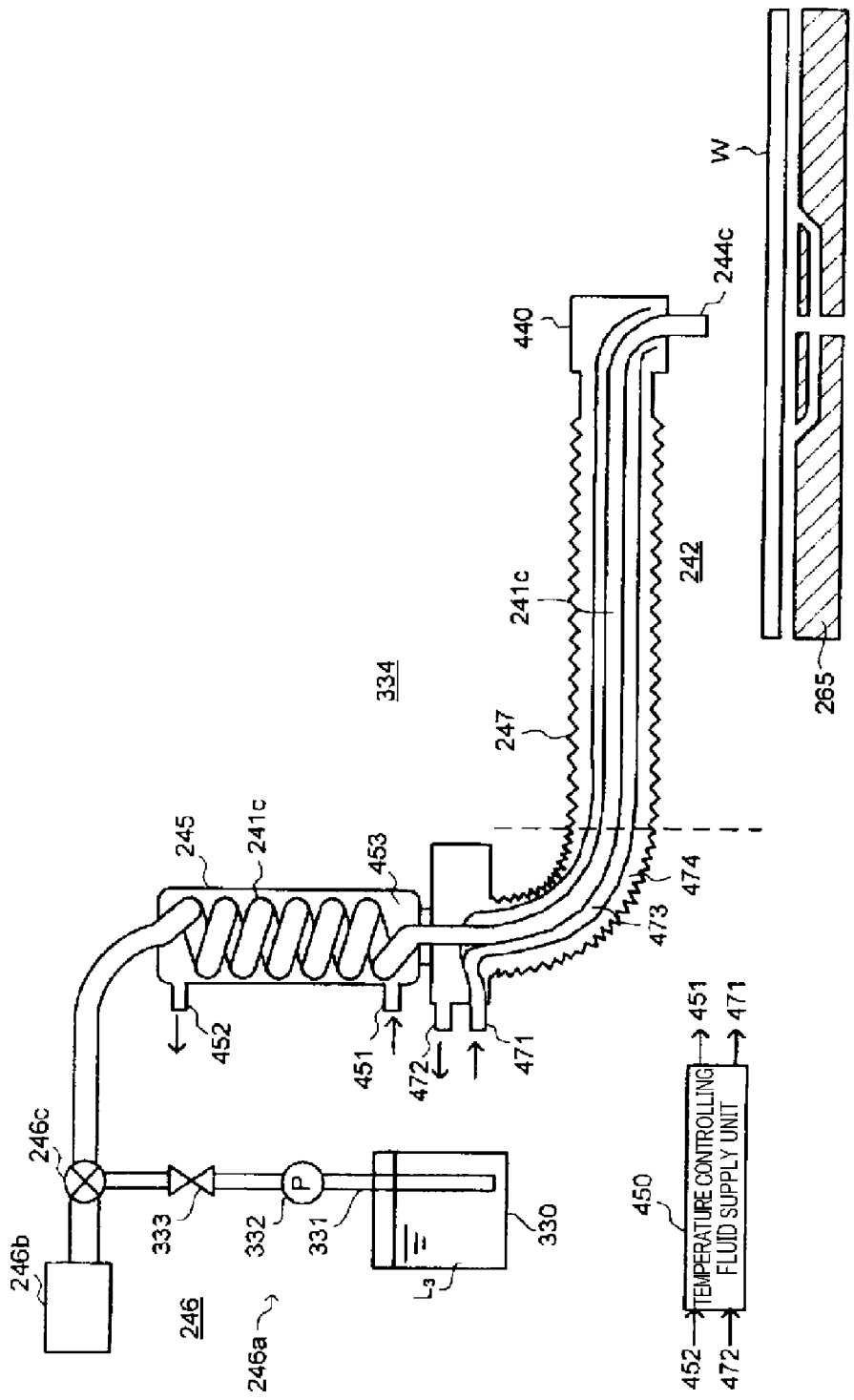
FIG. 7 is a schematic diagram perspectively illustrating a first arm of the liquid treatment unit in accordance with the illustrative embodiment.

Hereinafter, the first arm 242 of the first fluid supply unit 240 will be explained in detail with reference to FIG. 7. FIG. 7 is a schematic diagram illustrating a configuration of the first arm 242. As depicted in FIG. 7, the first arm 242 includes a temperature controller 245, a pump unit 246 having a supply unit 246a, a suction/collection unit 246b and a coupling unit 246c, and a temperature maintaining unit 247. That is, the liquid treatment unit 22 in accordance with the present illustrative embodiment includes the temperature control unit 334 shown in FIG. 6 and the temperature control unit 334 includes the temperature controller 245 and the temperature maintaining unit 247 provided at the first arm 242.

The temperature controller 245 is a heat exchanger that heats and cools the plating liquid or the like to be a temperature suitable for a process. The temperature controller 245 includes a sealed housing through which the pipe 241c passes, a fluid supply opening 451 through which a temperature control fluid (for example, hot water or cold water) is supplied from a temperature controlling fluid supply unit 450, and a fluid discharge opening 452 through which the fluid is discharged. The fluid supplied through the fluid supply opening 451 flows around the pipe 241c within an inner space 453 of the housing to heat or cool the plating liquid of the pipe 241c, and then, the fluid is discharged through the fluid discharge opening 452. Desirably, the pipe 241c within the temperature controller 245 may have, for example, a spiral shape to have a large contact area with the temperature control fluid. When the plating liquid is heated, a target temperature can be controlled in a range of, for example, from about 55° C. to about 80° C. depending on a composition of the plating liquid or film forming conditions. When the plating liquid is cooled, a target temperature is controlled to about room temperature, for example, about 30° C. or less.

The supply unit 246a includes the pump 332 and the valve 333 and serves as a pushing unit to push the plating liquid L₃ stored in the third tank 330 to the nozzle 244c through the pipe 241c. Further, in an example depicted in FIGS. 6 and 7, the plating liquid is pushed by the pump 332 and the valve 333 serving as the pushing unit, but is not limited thereto. By way of example, as the pump 332, a force-feed unit or a pressing unit such as a diaphragm pump may be used. The suction/collection unit 246b suctions and collects the plating liquid stored at a front end of the nozzle 244c right after completing the supply of the plating liquid to a process surface of the substrate. The coupling unit 246c connects a pipe connected to the supply unit 246a, a pipe connected to the suction/collection unit 246b, and a pipe connected to the temperature controller 245 with each other. The coupling unit 246c may be provided to be integrated with or separated from the valve 333. The supply unit 246a pushes a certain amount of the processing liquid toward the nozzle 244c at a certain speed and at certain timing based on a processing liquid supply instruction from the process controller 51.

The temperature maintaining unit 247 is provided between the temperature controller 245 and the nozzle 244c, and maintains a temperature of the plating liquid heated or cooled by the temperature controller 245 until the plating liquid is pushed through the nozzle 244c. The temperature maintaining unit 247 is provided to be separated from the temperature controller 245 and includes a sealed housing through which the pipe 241c passes, a fluid supply opening 471 through which a temperature control fluid supplied from the temperature controlling fluid supply unit 450 passes, and a fluid discharge opening 472 through which the fluid is discharged likewise. The fluid supplied from the temperature controlling fluid supply unit 450 may be identical with or different from the fluid supplied to the temperature controller 245. Within the temperature maintaining unit 247, a temperature maintaining pipe 473 connected to the fluid supply opening 471 is in contact with the pipe 241c and the plating liquid within the pipe 241c is maintained at a certain temperature. The temperature maintaining pipe 473 is extended to a vicinity of the nozzle 244c along the pipe 241c in the temperature maintaining unit 247, and maintains a temperature of the processing liquid right before the processing liquid is pushed through the nozzle 244c. A target temperature of the plating liquid maintained by the temperature maintaining unit 247 is substantially equal to the target temperature controlled by the temperature controller 245.

The temperature maintaining pipe 473 is opened within a nozzle housing 440 that accommodates the nozzle 244c and communicates with a space 474 within the temperature maintaining unit 247. That is, the temperature maintaining unit 247 has a triple structure (a triple-pipe structure) having the pipe 241c positioned at the center in its cross section, the temperature maintaining pipe 473 provided in thermal contact with an outer periphery of the pipe 241c, and the space 474 positioned at an outer periphery of the temperature maintaining pipe 473. A temperature maintaining fluid supplied from the fluid supply opening 471 maintains a temperature of the plating liquid through the temperature maintaining pipe 473 until the temperature maintaining fluid reaches the nozzle housing 440, and flows through the space 474 within the temperature maintaining unit 247. Then, the temperature maintaining fluid is discharged through the fluid discharge opening 472. The fluid flowing through the space 474 thermally insulates the fluid flowing through the temperature maintaining pipe 473 (and the plating liquid flowing through the inner pipe 241c) from an atmosphere outside the temperature maintaining unit 247. Therefore, it is possible to suppress a heat loss of the fluid flowing through the temperature maintaining pipe 473 and also possible to efficiently transfer a heat from the fluid flowing through the temperature maintaining pipe 473 to the plating liquid flowing through the pipe 241c.

The temperature maintaining unit 247 is provided at the first arm 242 operated by the nozzle driving device 305, and, thus, desirably, the temperature maintaining unit 247 may be a housing having a bellows shape or like, which can correspond to a movement. The temperature control fluid (hot water) supplied to the fluid supply opening 471 may be identical with or different from a fluid supplied to the fluid supply opening 451 with a temperature difference.

The pipe 241c has a part where the plating liquid is heated and the temperature thereof is maintained by the temperature controller 245 and the temperature maintaining unit 247, and a thickness and a length of the part are determined such that the entire plating liquid in an amount required for processing a certain number of wafers W can be heated and the temperature thereof can be maintained. That is, all the plating liquid heated and whose temperature is maintained by the temperature controller 245 and the temperature maintaining unit 247 is used for a plating process on the certain number of wafers W, and a plating liquid newly heated by the temperature controller 245 and whose temperature is maintained by the temperature maintaining unit 247 is supplied to a next target wafer W. In this manner, a plating process is continuously performed on a substrate with a plating liquid newly heated and whose temperature is maintained.

Further, the part where the plating liquid is heated and the temperature thereof is maintained by the temperature controller 245 and the temperature maintaining unit 247 may have a volume corresponding to a plating liquid in an amount required for processing a single wafer W. In this case, even if multiple wafers W are continuously processed, a plating process can be performed uniformly. By way of example, if an amount of a plating liquid heated and whose temperature is maintained by the temperature controller 245 and the temperature maintaining unit 247 at one time is set to an amount required for processing multiple wafers W, there occurs a difference between a time for heating a plating liquid during a first time plating process and a time for heating a plating liquid during a last time plating process. Typically, a plating liquid is deteriorated as it is heated. Therefore, if a plating liquid in an amount for multiple wafers W is heated at one time, a plating process may not be performed uniformly. By setting an amount of a plating liquid heated by the temperature controller 245 and the temperature maintaining unit 247 to an amount required for processing a single wafer W repeatedly as many times as needed, a more uniform plating process can be performed. By way of example, if a single substrate is processed, a volume of a plating liquid whose temperature is maintained by the temperature maintaining unit 247 may be about a tenth of a volume of a plating liquid heated by the temperature controller 245. By way of example, a volume of a plating liquid heated by the temperature controller 245 may be about 115 [ml] and a volume of a plating liquid whose temperature is maintained by the temperature maintaining unit 247 may be about 10 [ml].

The part where the plating liquid is heated and whose temperature is maintained by the temperature controller 245 and the temperature maintaining unit 247 may be smaller than the volume corresponding to a plating liquid in an amount required for processing a single wafer W. In this case, it is necessary to continuously supply the plating liquid to the temperature controller 245 and the temperature maintaining unit 247 in order to process the single wafer W.

As described above, the capacities (volumes) of the temperature controller 245 and the temperature maintaining unit 247, a supply flow rate of the plating liquid, and a temperature control rate of the plating liquid can be freely adjusted depending on a kind of the plating liquid.

If the process controller 51 instructs the fluid supply device 300 to supply the plating liquid $L_3$, the fluid supply device 300 operates the pump 332 and opens the valve 333. A detailed control of timing for supply of the plating liquid $L_3$ can be carried out by controlling the valve 333. Meanwhile, if the process controller 51 instructs the fluid supply device 300 to stop supplying the plating liquid $L_3$, the fluid supply device 300 closes the valve 333 and stops the pump 332, and also operates the suction/collection unit 246b to suction and collect the plating liquid $L_3$ remaining in the pipe 241c. Thus, it is possible to prevent the plating liquid $L_3$ from dropping down to the wafer W from the nozzle 244c. Further, the temperature controlling fluid supply unit 450 continuously supplies the fluid to the temperature controller 245 and the temperature maintaining unit 247 during the plating process since a time for heating the plating liquid $L_3$ can be adjusted depending on a process time to be described later.

The temperature control unit 334 of the liquid treatment unit 22 in accordance with the present illustrative embodiment is configured to heat or cool the plating liquid $L_3$ to a certain processing temperature by the temperature controller 245 and the temperature maintaining unit 247 provided at the first arm 242 in consideration of an effect of a lifetime of the plating liquid. If a plating process is continuously performed on multiple wafers W, the plating liquid $L_3$ to be used may be heated to a certain temperature at one time. In this case, between a plating liquid used for an earlier plating process and a plating liquid used for a later plating process, there is a time difference until they are actually used for the plating process after they reach a certain temperature. Further, as described below, the present inventors have found that after a temperature control, the plating liquid cannot be kept for a long time (i.e. after the plating liquid reaches a certain temperature, its properties are changed as time passes). Since the temperature control unit 334 in the present illustrative embodiment is provided within the first arm to heat a required minimum amount of the plating liquid, the plating liquid is uniform in properties during the plating process. In particular, if multiple substrates are processed, a plating liquid used for each substrate can be uniform in properties. Besides, the apparatus can have a compact size, and, thus, it is possible to suppress a temperature decrease of the plating liquid.

(Operation of a Liquid Treatment Unit in Accordance with an Illustrative Embodiment)

Figure 8:
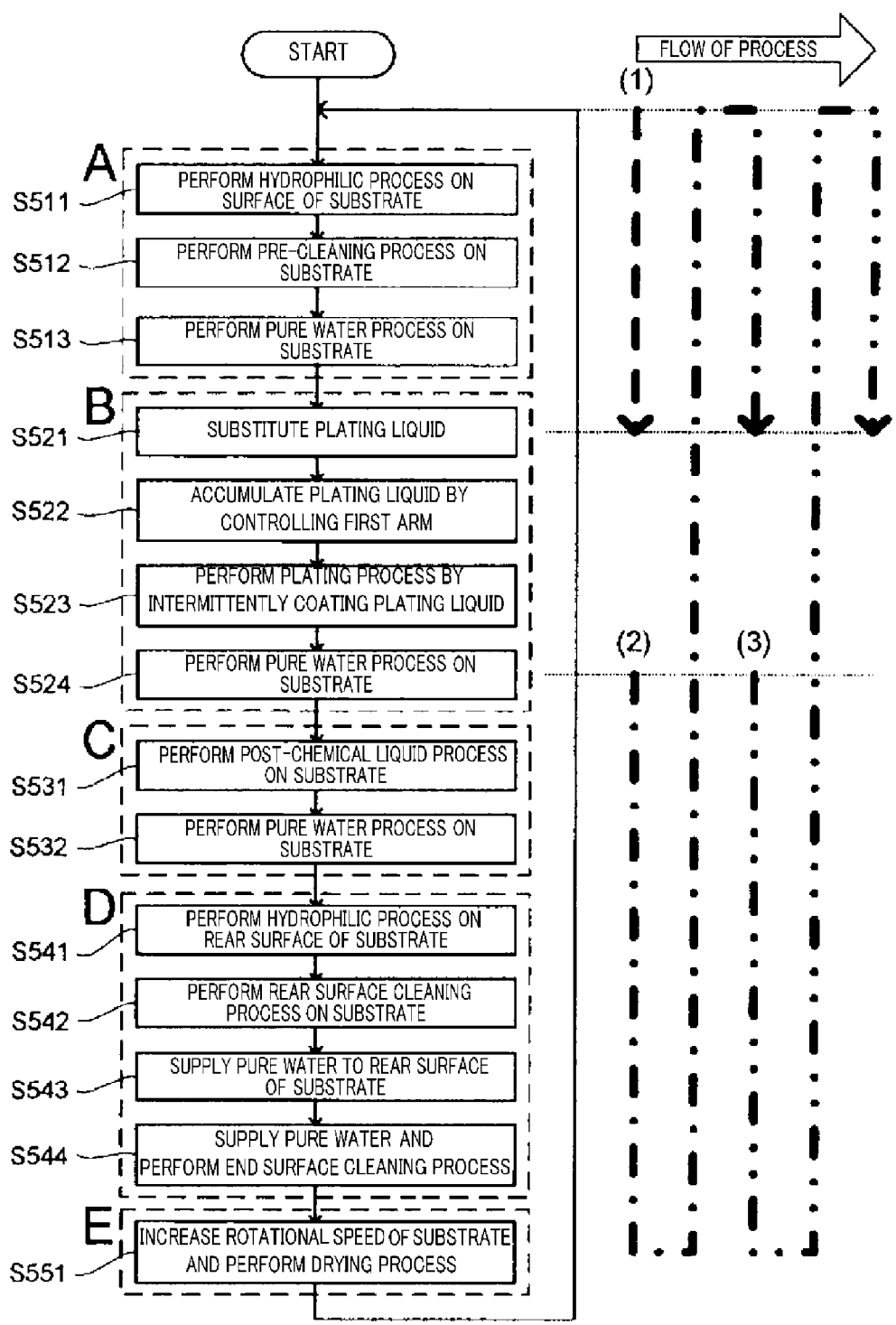
FIG. 8 is a flow chart showing an operation of the liquid treatment unit in accordance with the illustrative embodiment.

Hereinafter, the liquid treatment unit 22 in accordance with the present illustrative embodiment will be explained with reference to FIGS. 1 to 8. FIG. 8 is a flow chart showing operations, particularly a plating process operation, of the liquid treatment unit 22 in accordance with the illustrative embodiment. As depicted in FIG. 8, the liquid treatment unit 22 in accordance with the illustrative embodiment performs five processes including a pre-cleaning process ("A" in FIG. 8), a plating process ("B" in FIG. 8), a post-cleaning process ("C" in FIG. 8), a rear surface/end surface cleaning process ("D" in FIG. 8), and a drying process ("E" in FIG. 8).

The transfer device 15 unloads each wafer W from the wafer carrier C and loads the wafer W into the transit unit 13. When the wafer W is loaded, the transfer device 24 transfers the wafer W to each liquid treatment unit 22.

The process controller 51 performs the pre-cleaning process A. The pre-cleaning process A includes a hydrophilic process, a pre-cleaning process, and a pure water process.

The process controller 51 rotates the wafer W held on the spin chuck 230 by driving the motor 235. If the spin chuck 230 is rotated, the process controller 51 instructs the nozzle driving device 305 to drive the first fluid supply unit 240. The nozzle driving device 305 moves the first arm 242 to a preset position (for example, a position in which the nozzle 244a is located above a center of the wafer W) on the wafer W by operating the first rotation driving unit 243. Further, the nozzle driving device 305 moves the second arm 252 above a periphery of the wafer W by operating the second rotation driving unit 253. When the two arms reach their preset positions, the process controller 51 instructs the fluid supply device 300 to perform the hydrophilic process (S511). The fluid supply device 300 supplies a certain amount of the pure water $L_0$ into the nozzle 244a by opening the valve 360a. In this case, the nozzle 244a is located above the wafer W by, for example, about 0.1 mm to about 20 mm. Likewise, the fluid supply device 300 supplies the processing liquid $L_4$ into the nozzle 254 by opening the valve 343. In this process, the processing liquid $L_4$ may a hydrophilic effect different from the pure water $L_0$. The hydrophilic process prevents a pre-cleaning liquid from being scattered on the surface of the wafer W, and also suppresses the plating liquid from being dropped off the surface of the wafer W.

Then, the process controller 51 instructs the fluid supply device 300 to perform the pre-cleaning process and to supply the heated pure water to a rear surface of the wafer W. The fluid supply device 300 stops the supply of the pure water $L_0$ by closing the valve 360a and stops the supply of the processing liquid $L_4$ by closing the valve 343, and supplies the pre-cleaning processing liquid $L_1$ into the nozzle 244a by driving the pump 312 and the valve 313 (S512). Herein, since the nozzle 244a is moved above the substantially central portion of the wafer W, the nozzle 244a supplies the pre-cleaning processing liquid $L_1$ to the substantially central portion of the wafer W. Since an organic acid or the like is used as the pre-cleaning processing liquid, it is possible to remove a copper oxide from a copper wiring without causing galvanic corrosion and to increase a nucleation rate in the plating process.

Thereafter, the fluid supply device 300 supplies pure water into the fluid supply channel 271. The heat exchanger 275 controls a temperature of the pure water supplied into the fluid supply channel 271 and supplies the temperature-controlled pure water to the rear surface of the wafer W via the flow path 266 provided in the back plate 265. Thus, a temperature of the wafer W maintains at a temperature suitable for the plating process. Further, the same effect as described above can be obtained even if the supply of the pure water into the fluid supply channel 271 starts simultaneously with the above-described step S511.

If the pre-cleaning process is finished, the process controller 51 instructs the fluid supply device 300 to perform the pure water process (S513). The fluid supply device 300 stops the supply of the pre-cleaning processing liquid $L_1$ by operating the pump 312 and the valve 313 and supplies a certain amount of the pure water $L_0$ into the nozzle 244a by opening the valve 360a. By the supply of the pure water $L_0$ through the nozzle 244a, the pre-cleaning processing liquid is substituted with the pure water. Through this process, it is possible to prevent a problem caused by mixing of the acid pre-cleaning processing liquid $L_1$ with the alkaline plating liquid.

After the pre-cleaning process A, the process controller 51 performs the plating process B. The plating process B includes a plating liquid substitution process, a plating liquid coating process, a plating liquid process, and a pure water process.

The process controller 51 instructs the fluid supply device 300 and the nozzle driving device 305 to perform the plating liquid substitution process. The fluid supply device 300 stops the supply of the pure water $L_0$ by closing the valve 360a and supplies the plating liquid $L_3$ into the nozzle 244c by operating the pump 332 and the valve 333. The nozzle driving device 305 operates the first rotation driving unit 243 to rotate the first arm 242 such that the nozzle 244c is moved (scanned) from the central portion of the wafer W to the periphery of the wafer W, and then, back to the central portion of the wafer W (S521). In the plating liquid substitution process, the plating liquid supply nozzle is moved from the central portion of the wafer W to the periphery of the wafer W, and then, back to the central portion of the wafer W, and the wafer W is rotated at a relatively high rotational speed. Through this process, the plating liquid $L_3$ is diffused onto the wafer W, so that it is possible to rapidly substitute the pure water on the surface of the wafer W with the plating liquid.

After the plating liquid substitution process, the process controller 51 reduces a rotational speed of the wafer W held on the spin chuck 230 and instructs the fluid supply device 300 and the nozzle driving device 305 to perform the plating liquid coating process. The fluid supply device 300 keeps on supplying the plating liquid $L_3$ and the nozzle driving device 305 slowly moves the nozzle 244c from the central portion of the wafer W toward the periphery of the wafer W by operating the first rotation driving unit 243 (S522). A sufficient amount of the plating liquid $L_3$ is coated on the surface of the wafer W treated by the plating liquid substitution process. When the nozzle 244c approaches close to a vicinity of the periphery of the wafer W, the process controller 51 further reduces the rotational speed of the wafer W.

Then, the process controller 51 instructs the fluid supply device 300 and the nozzle driving device 305 to perform the plating process. The nozzle driving device 305 operates the first rotation driving unit 243 to rotate the first arm 242 such that the nozzle 244c is positioned substantially midway between the central portion of the wafer W and the periphery of the wafer W.

Thereafter, the fluid supply device 300 supplies the plating liquid $L_3$ into the nozzle 244c discontinuously and intermittently by operating the pump 332 and the valve 333 (S523). Since the wafer W is being rotated, the even if the plating liquid $L_3$ is supplied discontinuously (intermittently), the plating liquid $L_3$ can be diffused onto the entire surface of the wafer W. Further, the above-described steps S521 to S523 may be performed repeatedly. After a lapse of a certain time after the plating liquid $L_3$ is supplied, the fluid supply device 300 stops the supply of the plating liquid $L_3$ and the process controller 51 stops the supply of the heated pure water to the rear surface of the wafer W.

In the plating process B, in response to an instruction of the process controller 51, the fluid supply device 300 supplies the plating liquid $L_3$ into the nozzle 244c by operating the supply unit 246a. The supply unit 246a controls a push of the plating liquid to fill the pipes 241c of the temperature controller 245 and the temperature maintaining unit 247 with the plating liquid and to prevent the plating liquid from being dropped down from the nozzle 244c. The suction/collection unit 246b is configured to suction and collect the supplied plating liquid not to be dropped down from the nozzle 244c.

Further, the process controller 51 instructs the fluid supply device 300 and the nozzle driving device 305 to perform the pure water process. The process controller 51 increases the rotational speed of the wafer W held on the spin chuck 230. The nozzle driving device 305 operates the first rotation driving unit 243 to rotate the first arm 242 such that the nozzle 244c is positioned at the central portion of the wafer W. Then, the fluid supply device 300 supplies the pure water $L_0$ by opening the valve 360a. Thus, the plating liquid remaining on the surface of the wafer W can be removed, so that the mixing of the post-cleaning processing liquid with the plating liquid can be prevented.

After the plating process B, the process controller 51 performs the post-cleaning process C. The post-cleaning process C includes a post-chemical liquid process and a pure water process.

The process controller 51 instructs the fluid supply device 300 to perform the post-chemical liquid process. The fluid supply device 300 stops the supply of the pure water $L_0$ by closing the valve 360a and supplies the post-cleaning processing liquid $L_2$ into the nozzle 244b by operating the pump 322 and the valve 323 (S531). The post-cleaning processing liquid $L_2$ removes residues on the surface of the wafer W and an abnormally precipitated plating film.

After the post-chemical liquid process, the process controller 51 instructs the fluid supply device 300 to perform the pure water process. The fluid supply device 300 stops the supply of the post-cleaning processing liquid $L_2$ by operating the pump 322 and the valve 323. Further, the fluid supply device 300 supplies the pure water $L_0$ by opening the valve 360b (S532).

After the post-cleaning process C, the process controller 51 performs the rear surface/end surface cleaning process D. The rear surface/end surface cleaning process D includes a liquid removing process, a rear surface cleaning process, and an end surface cleaning process.

The process controller 51 instructs the fluid supply device 300 to perform the liquid removing process. The fluid supply device 300 stops the supply of the pure water $L_0$ by closing the valve 360b, and the process controller 51 increases the rotational speed of the wafer W held on the spin chuck 230. This process is performed to remove the liquid on the surface of the wafer W by drying the surface of the wafer W.

After the liquid removing process, the process controller 51 instructs the fluid supply device 300 to perform the rear surface cleaning process. The process controller 51 reduces the rotational speed of the wafer W held on the spin chuck 230. Then, the fluid supply device 300 supplies the pure water into the fluid supply channel 271. The heat exchanger 275 controls the temperature of the pure water supplied into the fluid supply channel 271 and supplies the temperature-controlled pure water to the rear surface of the wafer W via the flow path 266 provided in the back plate 265 (S541). The pure water performs a hydrophilic process on the rear surface of the wafer W. Then, the fluid supply device 300 stops the supply of the pure water into the fluid supply channel 271, and instead supplies a rear surface cleaning liquid into the fluid supply channel 271 (S542). The rear surface cleaning liquid washes away residues on the rear surface of the wafer W generated in the plating process.

Thereafter, the process controller 51 instructs the fluid supply device 300 and the nozzle driving device 305 to perform the end surface cleaning process. The fluid supply device 300 stops the supply of the rear surface cleaning liquid to the rear surface of the wafer W, and instead supplies the temperature-controlled pure water by the heat exchanger 275 into the fluid supply channel 271 (S543).

Then, the nozzle driving device 305 operates the second rotation driving unit 253 to rotate the second arm 252 such that the nozzle 254 is positioned above an end portion of the wafer W. The process controller 51 increases the rotational speed of the wafer W up to about 150 rpm to about 300 rpm. Likewise, the nozzle driving device 305 operates the first rotation driving unit 243 to rotate the first arm 242 such that the nozzle 244b is positioned above the central portion of the wafer W. The fluid supply device 300 supplies the pure water $L_O$ into the nozzle 244b by opening the valve 360b, and supplies the outer periphery processing liquid $L_4$ into the nozzle 254 by operating the pump 342 and the valve 343. That is, in this state, the pure water $L_O$ and the outer periphery processing liquid $L_4$ are supplied to the central portion of the wafer W and the end portion of the wafer W, respectively, while the temperature-controlled pure water is supplied to the rear surface of the wafer W (S544).

After the rear surface/end surface cleaning process D, the process controller 51 performs the drying process E. The drying process E includes a dry process.

The process controller 51 instructs the fluid supply device 300 and the nozzle driving device 305 to perform the dry process. The fluid supply device 300 stops the supply of all the processing liquids. The nozzle driving device 305 retreats the first arm 242 and the second arm 252 from above the wafer W. Further, the process controller 51 increases the rotational speed of the wafer W up to about 800 rpm to about 1000 rpm to dry the wafer W (S551). After the dry process, the process controller 51 stops the rotation of the wafer W, and the transfer device 24 unloads the wafer W from the spin chuck 230 through the window 215.

A sequence of the processes including the pre-cleaning process, the plating process, the post-cleaning process, the rear surface/end surface cleaning process, and the drying process and sequences of the supply/driving operation carried out by the fluid supply device 300, the nozzle driving device 305, and the temperature controlling fluid supply unit 450 and operations of various valves and pumps are stored in the storage unit. The process controller 51 gives operation/control instructions to respective constituent elements based on the stored data.

Hereinafter, there will be explained an operation of the temperature controller 245 in the whole plating process if a plating liquid is heated and the temperature thereof is maintained whenever the temperature controller 245 and the temperature maintaining unit 247 handle the plating liquid corresponding to a single plating process. The temperature controller 245 heats the plating liquid flowing through the pipe 241c to a certain temperature. To be specific, in an initial state (in a state where a first substrate is processed), during step S511 to step S521 in FIG. 8, the temperature controller 245 heats the plating liquid to a certain temperature and the temperature maintaining unit 247 maintains the temperature of the plating liquid, that flows through the pipe 241c and is heated by the temperature controller 245, at the certain temperature (during a time period indicated by a dashed line (1) in FIG. 8). At this time, since the plating liquid is not dropped down from the nozzle 244c, the plating liquid may be heated and maintained at the certain temperature. In the plating process B, the plating liquid is supplied through each of the plating liquid substitution process, the plating liquid coating process, and the plating process. Therefore, since the plating liquid flows through the pipe, most of the plating liquid is not heated (or it is difficult to be heated).

After the process on the first substrate is ended, if the pure water process of step S524 is performed, the supply of the plating liquid is stopped. Therefore, the temperature controller 245 can restart heating the plating liquid. A time period for heating a plating liquid used for processing a second substrate starts from step S524 where the plating process B on the first substrate is ended to step S521 where the plating process B on the second substrate is started (during a time period indicated by a dashed dotted line (2) in FIG. 8). Likewise, a time period for heating a plating liquid used for processing a third substrate is indicated by a dashed double-dotted line (3) in FIG. 8. That is, the plating liquids used for processing the substrates are heated during the time periods indicated by the lines (1) to (3) in FIG. 8. Process conditions of the plating liquid vary depending on a time period for heating the processing liquid as well as a temperature of the plating liquid in the plating process. Accordingly, it is desirable that the time periods indicated by the lines (1) to (3) are equal to one another so that the plating process is performed in a uniform manner.

Although the plating liquid is supplied based on a time and a timing instructed by the process controller 51, the whole amount of the plating liquid flowing through the pipe 241c within the temperature controller 245 and the temperature maintaining unit 247 during the single plating process is supplied. That is, when the single plating process is ended, the pipe 241c within the temperature controller 245 and the temperature maintaining unit 247 is filled with a new plating liquid which is not heated.

(Configuration of a Temperature Controlling Fluid Supply Unit in Accordance with an Illustrative Embodiment)

Figure 9A:
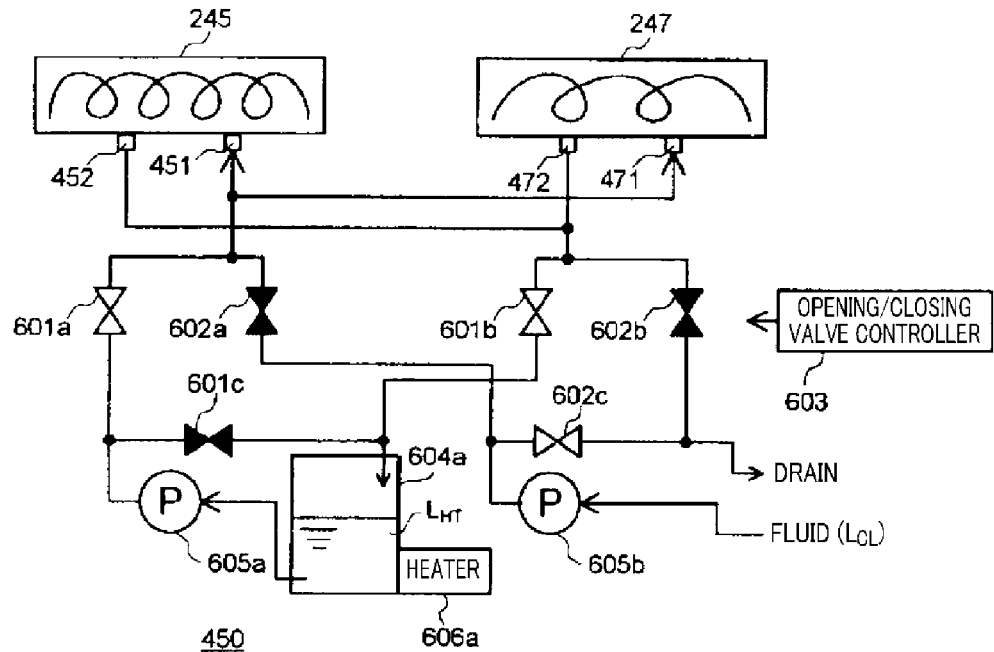
FIG. 9A illustrates a configuration example of a temperature controlling fluid supply unit in accordance with the illustrative embodiment.

Hereinafter, the temperature controlling fluid supply unit 450 (fluid supply unit 450) of the liquid treatment unit in accordance with the present illustrative embodiment will be explained in detail with reference to FIGS. 9A and 10. As depicted in FIG. 9A, the fluid supply unit 450 in accordance with the present illustrative embodiment includes valves 601a to 602c, an opening/closing valve controller 603, a heating tank 604a, pumps 605a and 605b, and a heater (heating unit) 606a.

A fluid $L_{HT}$ (high-temperature fluid) stored in the heating tank 604a is supplied to an input end of the pump 605a, and an output end of the pump 605a is connected to the fluid supply opening 451 of the temperature controller 245 via the valve 601a. The fluid discharge opening 452 of the temperature controller 245 is connected to the heating tank 604a via the valve 601b. Meanwhile, the output end of the pump 605a is also connected to the fluid supply opening 471 of the temperature maintaining unit 247 via the valve 601a. The fluid discharge opening 472 of the temperature maintaining unit 247 is connected to the heating tank 604a via the valve 601b. Further, the output end of the pump 605a is connected to the heating tank 604a via the valve 601c. The heating tank 604a includes the heater 606a, and the heater 606a is configured to heat the fluid $L_{HT}$ stored in the heating tank 604a to a certain temperature.

Meanwhile, a fluid $L_{CL}$ (low-temperature fluid) at room temperature is supplied to an input end of the pump 605b, and an output end of the pump 605b is connected to the fluid supply opening 451 of the temperature controller 245 via a valve 602a. The fluid discharge opening 452 of the temperature controller 245 is connected to a drain via a valve 602b. Further, the output end of the pump 605b is also connected to the fluid supply opening 471 of the temperature maintaining unit 247 via the valve 602a. The fluid discharge opening 472 of the temperature maintaining unit 247 is connected to the drain via the valve 602b. Further, the output end of the pump 605b is connected to the drain via a valve 602c.

The opening/closing valve controller 603 controls opening and closing of the valves 601a, 601b, 601c, 602a, 602b, and 602c. To be specific, the opening/closing valve controller 603 performs a control (hot water supply control) of opening the valves 601a, 601b, and 602c and closing the valves 601c, 602a, and 602b, a control (cold water supply control) of closing the valves 601a, 601b, and 602c and opening the valves 601c, 602a, and 602b, and a control (stabilization control) of opening the valves 601a, 602b, and 602c and closing the valves 601c, 602a, and 601b.

That is, the opening/closing valve controller 603 forms a flow path through which the fluid $L_{HT}$ heated by the heater 606a is supplied to the temperature controller 245 and the temperature maintaining unit 247 during the hot water supply control, and forms a flow path through which the fluid $L_{CL}$ at room temperature flows to the drain via the pump 605b and the valve 602c (formation of a heating flow path). At this time, the pump 605a circulates the fluid $L_{HT}$ as a heat transfer medium through the heating tank 604a, the valve 601a, the temperature controller 245, and the valve 601b in sequence, and also circulates the fluid $L_{HT}$ through the heating tank 604a, the valve 601a, the temperature maintaining unit 247, and the valve 601b in sequence. Through these circulations, the heated fluid $L_{HT}$ is supplied continuously to the temperature controller 245 and the temperature maintaining unit 247.

Likewise, the opening/closing valve controller 603 forms a flow path through which the fluid $L_{CL}$ supplied from a fluid supply source is supplied to the temperature controller 245 and the temperature maintaining unit 247 during the cold water supply control, and forms a flow path through which the fluid heated by the heater 606a circulates via the pump 605a, the valve 601c, and the heating tank 604a in sequence (formation of a cooling flow path). At this time, the pump 605b circulates the fluid $L_{CL}$ at room temperature through the valve 602a, the temperature controller 245, the valve 602b, and the drain in sequence, and also circulates the fluid $L_{CL}$ through the valve 602a, the temperature maintaining unit 247, the valve 602b, and the drain in sequence. Through these circulations, the fluid $L_{CL}$ as cooling water is supplied continuously, and the heated fluid is maintained at a certain temperature within the heating tank 604a.

(Operation of a Temperature Controlling Fluid Supply Unit in Accordance with an Illustrative Embodiment)

There will be explained an operation of the fluid supply unit 450 in accordance with the present illustrative embodiment with reference to FIGS. 8, 9A, and 10. If the pre-cleaning process A shown in FIG. 8 is started, the process controller 51 starts to operate the heater 606a to heat the fluid $L_{HT}$ stored in the heating tank 604a (S610).

If the heater 606a is operated, the opening/closing valve controller 603 sets the respective valves such that the heating flow path is formed (S611). That is, the opening/closing valve controller 603 performs the hot water supply control by opening the valves 601a, 601b, and 602c and closing the valves 601c, 602a, and 602b. Thus, the fluid $L_{HT}$ heated by the heater 606a is supplied to the temperature controller 245 and the temperature maintaining unit 247, and the plating liquid is heated and the temperature thereof is maintained at a certain temperature.

In each of the pre-cleaning process A, the plating process B, the post-cleaning process C, the rear surface/end surface cleaning process D, and the drying process E shown in FIG. 8, the plating liquid is heated to a certain temperature. Therefore, typically, the hot water supply control is continuously performed up to this step ("No" in S612).

Meanwhile, a liquid treatment may be stopped for some reasons such as a stop of an apparatus caused by a change in parameter for the liquid treatment or an error in a process. In this case, the fluid supply device 300 stops the supply of the plating liquid automatically or in response to an instruction of a user ("Yes" in S612).

The opening/closing valve controller 603 refers to timing information that shows timing for supplying the plating liquid. Further, the opening/closing valve controller 603 monitors the timing for supplying the plating liquid and whether the supply is stopped or not. If the supply of the plating liquid is stopped, the opening/closing valve controller 603 counts a stop time period during which the supply of the plating liquid is stopped (S613). The opening/closing valve controller 603 keeps on counting until a counted time period exceeds a preset critical value ("No" in S613).

If the counted time period exceeds the preset critical value, i.e., the stop time period exceeds a certain time period ("Yes" in S613), the opening/closing valve controller 603 sets the respective valves such that the cooling flow path is formed (S614). That is, the opening/closing valve controller 603 performs a cold water supply control by closing the valves 601a, 601b, and 602c and opening the valves 601c, 602a, and 602b. Thus, the fluid $L_{CL}$ at room temperature is supplied to the temperature controller 245 and the temperature maintaining unit 247, and the plating liquid is cooled within the temperature controller 245 and the temperature maintaining unit 247.

The plating liquid is cooled until the supply of the plating liquid is started ("No" in S615). If an instruction of starting the supply of the plating liquid is received ("Yes" in S615), the opening/closing valve controller 603 sets the respective valves such that the stabilization flow path for stabilization control is formed. The opening/closing valve controller 603 opens the valves 601a and 602c and closes the valves 601c and 602a. That is, the opening/closing valve controller 603 performs the control while the valve 601b is closed and the valve 602b is opened (formation of a stabilization flow path). The fluid $L_{HT}$ heated by the heater 606a flows through the valve 601a, the temperature controller 245 and the temperature maintaining unit 247, and the valve 602b to be discharged through the drain by the pump 605a. Accordingly, it is possible to prevent the fluid $L_{CL}$ at room temperature within the temperature controller 245 and the temperature maintaining unit 247 from being introduced into the heating tank 604a and also prevent a temperature of the fluid $L_{HT}$ from being unstable (S616). This process is continuously performed for about 1 minute.

Then, the opening/closing valve controller 603 forms the heating flow path by opening the valve 601b and closing the valve 602b. Thus, the opening/closing valve controller 603 restarts the hot water supply control in which the fluid $L_{HT}$ is heated and supplied to the temperature controller 245 and the temperature maintaining unit 247 (S617). Thereafter, steps S612 to S617 are carried out repeatedly.

In the liquid treatment unit in accordance with the present illustrative embodiment, the fluid supply unit 450 can selectively supply the heated fluid and the fluid at room temperature to the temperature controller 245 and the temperature maintaining unit 247. Therefore, even if the plating process is stopped, the plating liquid within the temperature controller 245 and the temperature maintaining unit 247 can be cooled and reheated. That is, by cooling the heated plating liquid, it is possible to prevent the plating liquid from being deteriorated. Accordingly, even after the plating liquid is supplied to the temperature controller 245 and the temperature maintaining unit 247 and heated therein, the plating process can be stopped without the conventional problems, and the process can be performed with freshness of the processing liquid maintained.

Further, in the liquid treatment unit in accordance with the present illustrative embodiment, the fluid supply unit 450 includes the flow path for the hot water supply control and the flow path for the cold water supply control, and controls the fluid flow with the valves. Therefore, the heating of the fluid and the cooling of the fluid can be rapidly switched with each other. That is, the plating liquid flowing in the temperature controller 245 and the temperature maintaining unit 247 can be cooled and reheated rapidly.

Furthermore, in the liquid treatment unit in accordance with the present illustrative embodiment, when changing the fluid to be supplied to the temperature controller 245 and the temperature maintaining unit 247 from the fluid at room temperature to the heated fluid, the fluid supply unit 450 controls the fluid at room temperature not to be directly mixed with the heated fluid. Therefore, the plating liquid in the temperature controller 245 and the temperature maintaining unit 247 can be heated stably.

(Modification Example of a Temperature Controlling Fluid Supply Unit in Accordance with an Illustrative Embodiment)

There will be explained a modification example of a temperature controlling fluid supply unit in accordance with an illustrative embodiment with reference to FIG. 9B. Hereinafter, same parts as those of the fluid supply unit 450 in FIG. 9A will be assigned same reference numerals, and redundant description thereof will be omitted.

Figure 9B:
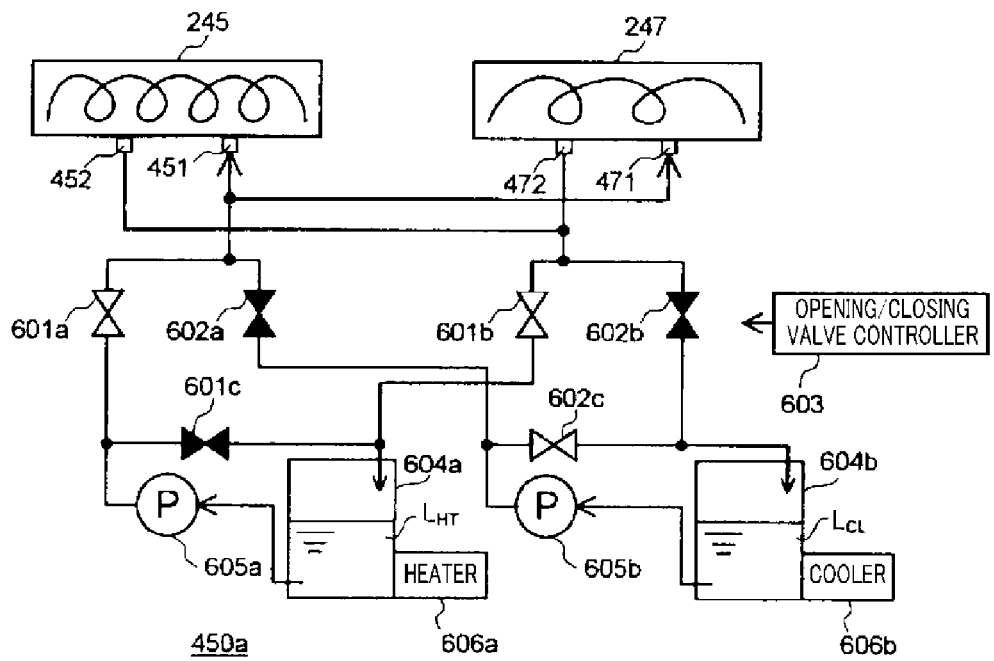
FIG. 9B illustrates a configuration example of the temperature controlling fluid supply unit in accordance with the illustrative embodiment.

A fluid supply unit 450a depicted in FIG. 9B includes a cooling tank 604b having a cooler 606b (cooling unit) as a supply source of the fluid $L_{CL}$. That is, the fluid $L_{CL}$ stored in the cooling tank 604b is supplied to the input end of the pump 605b, and the cooling tank 604b is connected to the fluid discharge opening 452 of the temperature controller 245 and the fluid discharge opening 472 of the temperature maintaining unit 247 via the valve 602b. Further, the output end of the pump 605b is connected to the cooling tank 604b via the valve 602c. The cooling tank 604b includes the cooler 606b configured to cool the fluid $L_{CL}$ stored in the cooling tank 604b to a certain temperature.

In the fluid supply unit 450a configured as described above, the fluid $L_{CL}$ flowing through the temperature controller 245 and the temperature maintaining unit 247 is stored in the cooling tank 604b, and the stored fluid $L_{CL}$ is cooled by the cooler 606b. Therefore, the plating liquid can be cooled efficiently. Further, in the fluid supply unit 450a configured as described above, the fluid $L_{CL}$ cooling the plating liquid within the temperature controller 245 and the temperature maintaining unit 247 is cooled by the cooler 606b. Therefore, a temperature of the cooled plating liquid can be set accurately. Furthermore, in the fluid supply unit 450a configured as described above, the fluid $L_{CL}$ is not discharged through a drain but stored in the cooling tank 604b. Therefore, the used fluid $L_{CL}$ can be reused.

(Effect of a Temperature Controlling Fluid Supply Unit in Accordance with an Illustrative Embodiment)

Figure 12:
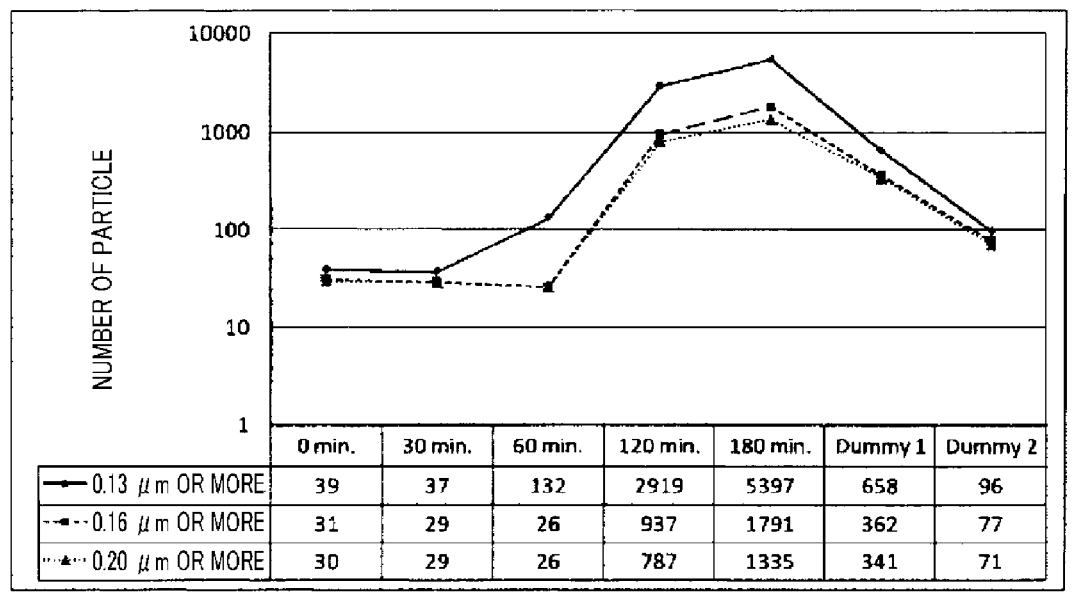
FIG. 12 illustrates a relationship between a time for heating a plating liquid and the number of particles generated from the plating liquid.

Hereinafter, an effect of the fluid supply unit 450 (450a) depicted in FIGS. 9A to 10 will be explained with reference to FIGS. 7 to 12. FIG. 12 illustrates a relationship between a time for heating a plating liquid and the number of particles generated from the plating liquid during a plating process using DMAB (dimethylamineborane) as a reducing agent.

When performing a plating process through the pre-cleaning process A, the plating process B, the post-cleaning process C, the rear surface/end surface cleaning process D, and the drying process E shown in FIG. 8, after a n-th drying process E is performed and before a (n+1)-th pre-cleaning process A is started, the processed wafer W is unloaded and a new unprocessed wafer W is loaded. In order to obtain a plating liquid having a certain temperature and a certain film forming rate during the plating process B, the plating liquid is heated to the certain temperature before the plating process B is started, and the plating liquid needs to be heated for a certain time period ("timing (1)" in FIG. 11).

However, it is known that if the plating liquid at room temperature is heated, deterioration thereof is started. As depicted in FIG. 12, if about 30 minutes elapse after the plating liquid is started to be heated, the number of small-sized particles (particles of about 0.13 μm (micrometer) or more) is increased, and if about 60 minutes or more elapse, the number of particles is sharply increased regardless of size. Therefore, if "process waiting time" such as $\Delta t_{21}$ or $\Delta t_{22}$ in FIG. 11 occurs during the plating process, the heated plating liquid stored in the temperature controller 245 and the temperature maintaining unit 247 becomes deteriorated.

It is deemed that the particles generated by heating the plating liquid may be due to a reaction of the reducing agent caused by the heating. A reaction example of the plating liquid including the DMAB as a reducing agent is expressed in the following chemical formula (1).

[Chemical formula (1)]

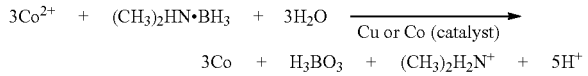

$$3Co^{2+} + (CH_3)_2HN \cdot BH_3 + 3H_2O \xrightarrow{Cu \text{ or } Co \text{ (catalyst)}} 3Co + H_3BO_3 + (CH_3)_2H_2N^+ + 5H^+$$

From a left side of the chemical formula (I) showing the plating liquid, DMAB (($CH_3$)$_2$HN.BH$_3$) is an unstable reducing agent which can react slightly at room temperature. If this plating liquid is heated, it can further react without catalysis of Cu or Co. If the heated plating liquid remains within the temperature controller 245 and the temperature maintaining unit 247 for a long time, decomposition of the DMAB is started as shown in the chemical formula (1) and Co is precipitated. Then, the precipitated Co serves as a catalyst, and a reaction of the DMAB in the plating liquid is further accelerated. As a result, it is deemed that CoWB crystals are precipitated as particles from the plating liquid within the temperature controller 245 and the temperature maintaining unit 247. Referring to FIG. 12, a sharp increase in the number of particles after about 60 minutes elapse is caused by such a reaction.

Conventionally, if the plating process is stopped while the plating liquid is heated and remains the temperature controller 245 and the temperature maintaining unit 247, a dummy wafer is prepared and the heated plating liquid is discharged and discarded on the dummy wafer. That is, by discarding the plating liquid in which particles are generated, a quality of the whole plating liquid is maintained. Referring to FIG. 12, "Dummy 1" represents the number of the particles after the plating liquid of about 200 [mL] is discharged, and "Dummy 2" represents the number of particles after the plating liquid of about 400 [mL] is discharged. As depicted in FIG. 12, after the plating liquid is heated and about 180 minutes elapse, the heated plating liquid is discharged and discarded on the dummy wafer and the number of particles in the whole plating liquid is decreased.

In the liquid treatment unit with the data shown in FIG. 12, a volume of the temperature controller 245 and the temperature maintaining unit 247 containing the plating liquid (an amount of the plating liquid for processing a single wafer W) is about 200 [mL]. That is, in "Dummy 1" in FIG. 12, the plating liquid in an amount for a single wafer is discharged, and in "Dummy 2" in FIG. 12, the plating liquid in an amount for two wafers is discharged. That is, in accordance the example shown in FIG. 12, it is deemed that an amount of the plating liquid to be discarded is about 2 times an amount of the plating liquid heated in the temperature controller 245 and the temperature maintaining unit 247, so that the precipitated CoWB crystals are removed. However, if the heated plating liquid is discarded, process efficiency is decreased.

Meanwhile, by using the suction/collection unit 246b depicted in FIG. 7, it is possible to suction and collect the plating liquid within the temperature controller 245 and the temperature maintaining unit 247 into the third tank 330. However, it is not desirable to return the heated plating liquid to the third tank 330 since a quality of the whole plating liquid is deteriorated.

In this case, the fluid supply unit 450 in accordance with the illustrative embodiment cools the plating liquid within the temperature controller 245 and the temperature maintaining unit 247 by switching a fluid for heating supplied to the temperature controller 245 and the temperature maintaining unit 247 with a fluid for cooling. As a result, it is possible to prevent the plating liquid from being deteriorated.

Further, it may be considered that a temperature of the fluid $L_{HT}$ for heating is controlled to be decreased without using the fluid $L_{CL}$ for cooing. However, it is difficult to rapidly cool the plating liquid due to a thermal capacity in this case. Therefore, the fluid supply unit 450 (450a) in accordance with the illustrative embodiment does not control a heating temperature of the fluid $L_{HT}$ for heating, but switches between the heated fluid $L_{HT}$ for heating and the fluid $L_{CL}$ for cooling at room temperature (or cooled and maintained at room temperature) by using a valve group.

(Temperature and Time for Cooling a Plating Liquid)

Figure 13:
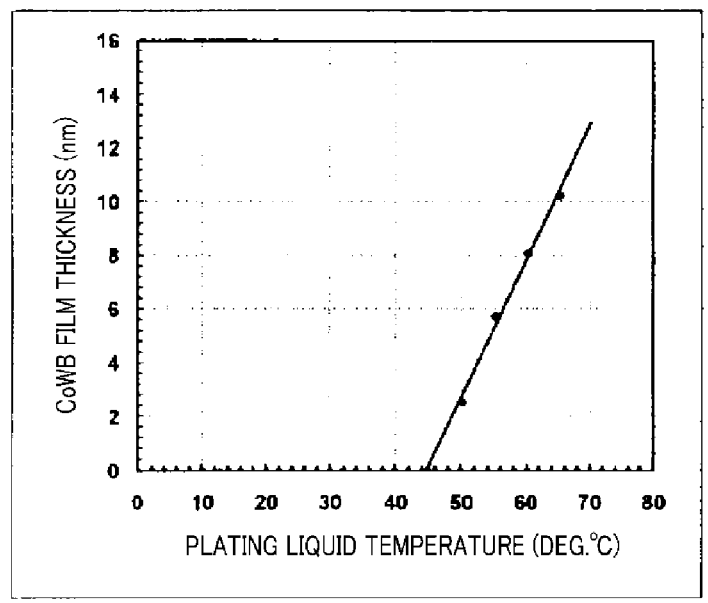
FIG. 13 illustrates a relationship between a processing temperature and a coating thickness in a plating process.

Hereinafter, there will be explained a temperature and a time for cooing a plating liquid by the fluid supply unit 450 in accordance with the illustrative embodiment by referring to FIGS. 12 and 13. FIG. 13 illustrates a relationship between a processing temperature and a coating thickness in a plating process.

As depicted in FIG. 13, it can be seen that in a plating process for forming a CoWB film, when a temperature of a plating liquid is more than about 45° C., the formation of the CoWB film is started. That is, in order to suppress precipitation of CoWB crystals, the temperature of the plating liquid needs to be about 40° C. or less. Considering a temperature distribution in the plating liquid, the temperature of the plating liquid may be desirably about room temperature and more desirably about 30° C. or less, so that it is possible to suppress precipitation of CoWB crystals.

As depicted in FIG. 12, in the plating liquid including the DMAB as a reducing agent, after the plating liquid is heated to a processing temperature and about 30 minutes elapse, the number of particles is increased. Therefore, it is desirable that a heated state of the plating liquid (a state where a temperature of the plating liquid exceeds room temperature) is not continued for more than about 30 minutes. Actually, a certain time period is required for cooling the plating liquid due to a thermal capacity. Therefore, it is desirable that a time until the plating liquid is reheated and the plating process is restarted after cooling the plating liquid is less than about 30 minutes.

Figure 10:
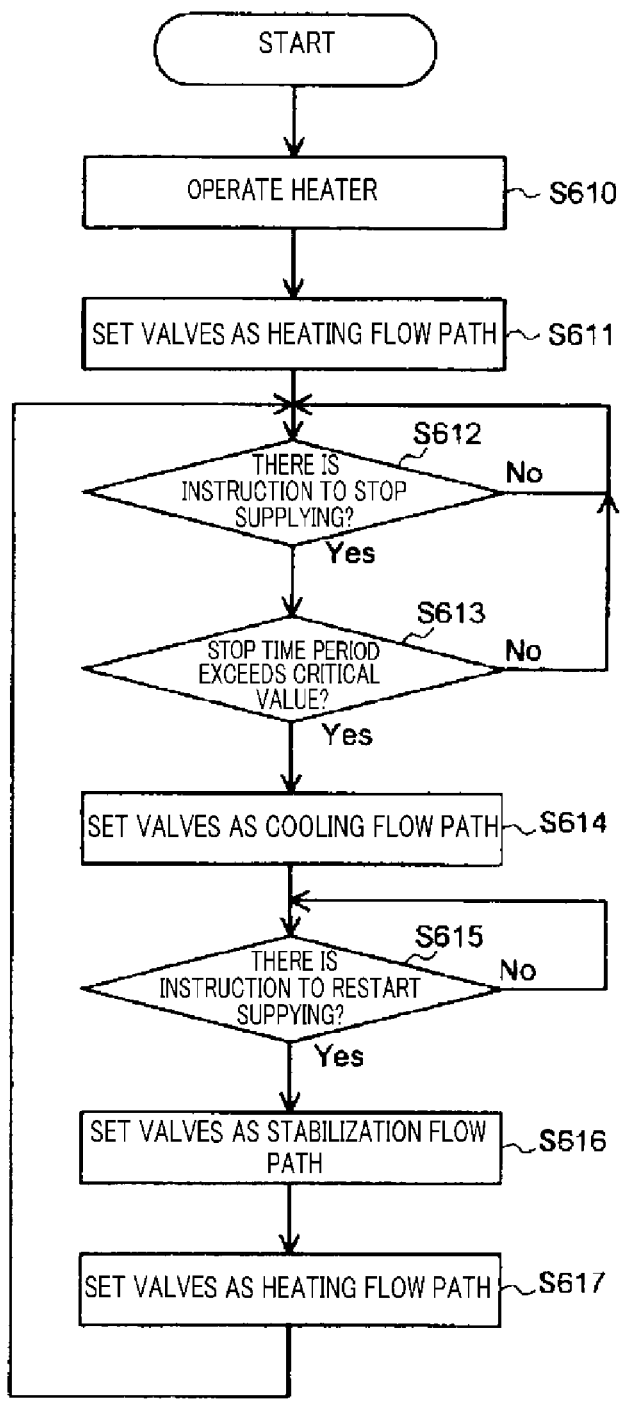
FIG. 10 is a flow chart showing an operation of the temperature controlling fluid supply unit in accordance with the illustrative embodiment.
Figure 11:
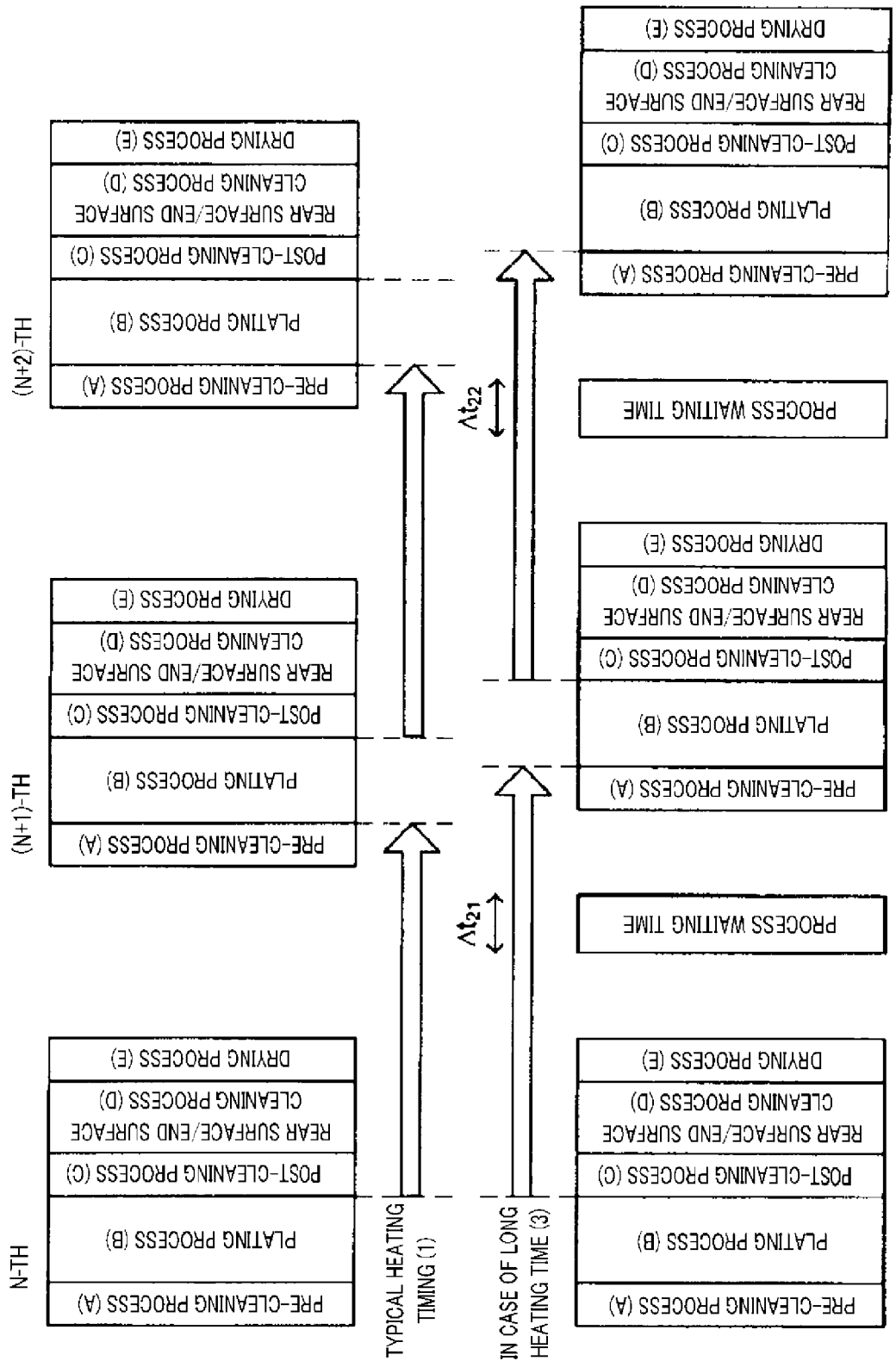
FIG. 11 is an explanatory diagram that explains a process waiting time during a liquid treatment.

Accordingly, by way of example, if a time period for stopping the supply of the plating liquid exceeds about 10 minutes in step S613 of FIG. 10, there may be a cycle in which the plating liquid is rapidly cooled (in about 5 minutes) in step S614 and the plating liquid within the temperature controller 245 and the temperature maintaining unit 247 is reheated for about 10 minutes after starting the supply of the plating liquid in step S615.

As described above, in accordance with the liquid treatment unit in accordance with the present illustrative embodiment, there is provided a fluid supply unit capable of heating and cooling a processing liquid within a temperature controller and a temperature maintaining unit. Therefore, even if a process waiting time occurs, it is possible to prevent the processing liquid from being deteriorated. Further, there is no need to dummy-dispense the processing liquid stored in the temperature controller and the temperature maintaining unit even when a waiting time occurs, and, thus, it is possible to suppress a decrease in efficiency.

The present disclosure is not limited to the above-described illustrative embodiments and the modification example thereof. The present disclosure is not limited to the illustrative embodiments themselves and constituent elements can be modified and changed in an embodiment within the scope of the present disclosure. Further, the constituent elements described in the above illustrative embodiments can be combined appropriately to form various inventions. By way of example, some constituent elements may be removed from all the constituent elements shown in the illustrative embodiment and the constituent elements in different illustrative embodiments may be combined appropriately.

What is claimed is:

1. A liquid treatment apparatus of continuously performing a plating process on a plurality of substrates, the liquid treatment apparatus comprising:
   a temperature controlling container configured to accommodate a plating liquid;
   a temperature controller configured to control a temperature of the plating liquid accommodated in the temperature controlling container;
   a holding unit configured to hold the substrates one by one at a predetermined position;
   a nozzle having a supply hole through which the temperature-controlled plating liquid accommodated in the temperature controlling container is discharged to a processing surface of the substrate held by the holding unit;
   a pushing unit configured to push the temperature-controlled plating liquid accommodated in the temperature controlling container toward the supply hole of the nozzle; and
   a supply control unit configured to control a timing when the plating liquid is pushed by the pushing unit,
   wherein the temperature controller is configured to control the temperature of the plating liquid accommodated in the temperature controlling container based on the timing when the plating liquid is pushed by the pushing unit,
   wherein the temperature controller is configured to perform a cooling control of the plating liquid accommodated in the temperature controlling container if the plating liquid is not pushed toward the supply hole of the nozzle for a predetermined time period.

2. The liquid treatment apparatus of claim 1,
   wherein during the cooling control, the temperature controller is configured to cool the plating liquid accommodated in the temperature controlling container to room temperature.

3. The liquid treatment apparatus of claim 1,
   wherein the temperature controller comprises a fluid supply unit configured to supply any one of a high-temperature fluid and a low-temperature fluid to the temperature controlling container based on the timing when the plating liquid is pushed by the pushing unit, and
   the temperature controlling container comprises a heat exchanger configured to heat or cool the plating liquid accommodated therein by using the high-temperature fluid or the low-temperature fluid supplied from the fluid supply unit.

4. The liquid treatment apparatus of claim 3,
wherein the fluid supply unit comprises:
a heating unit configured to heat a fluid to make the high-temperature fluid;
a cooling unit configured to cool a fluid to make the low-temperature fluid; and
a supplying unit configured to supply any one of the high-temperature fluid and the low-temperature fluid to the temperature controlling container.

5. The liquid treatment apparatus of claim 1,
wherein an amount of the plating liquid accommodated in the temperature controlling container is equal to or less than a predetermined amount required for processing a single substrate.

6. A liquid treatment method of continuously performing a plating process on a plurality of substrates, the liquid treatment method comprising:
accommodating a plating liquid in a temperature controlling container;
heating the plating liquid accommodated in the temperature controlling container to a predetermined temperature;
generating timing information for pushing the plating liquid accommodated in the temperature controlling container toward a supply hole through which the plating liquid is discharged to a processing surface of the substrate; and
cooling the plating liquid accommodated in the temperature controlling container based on the timing information,
wherein the temperature controller is configured to perform a cooling control of the plating liquid accommodated in the temperature controlling container if the plating liquid is not pushed toward the supply hole of a nozzle for a predetermined time period.

7. The liquid treatment method of claim 6,
wherein an amount of the plating liquid accommodated in the temperature controlling container is equal to or less than a predetermined amount required for processing a single substrate.

* * * * *

UNITED STATES PATENT AND TRADEMARK OFFICE
CERTIFICATE OF CORRECTION

PATENT NO. : 8,937,014 B2
APPLICATION NO. : 13/879175
DATED : January 20, 2015
INVENTOR(S) : Takashi Tanaka et al.

Page 1 of 1

It is certified that error appears in the above-identified patent and that said Letters Patent is hereby corrected as shown below:

In the Specification,

Column 3, line 47, please add -- 13 -- between "unit" and "that"

Column 4, line 19-20, please add -- 22 -- between "treatment unit" and "are provided"

Column 5, line 52, please add -- 20 -- between "bracket" and "provided"

Signed and Sealed this
Thirtieth Day of June, 2015

Michelle K. Lee
*Director of the United States Patent and Trademark Office*